US012813003B2

(12) United States Patent
Lee et al.

(10) Patent No.: US 12,813,003 B2
(45) Date of Patent: Nov. 24, 2026

(54) IMAGE SENSOR

(71) Applicant: Samsung Electronics Co., Ltd., Suwon-si (KR)

(72) Inventors: Jaekyu Lee, Suwon-si (KR); Changyong Um, Suwon-si (KR); Dongseok Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 410 days.

(21) Appl. No.: 18/494,156

(22) Filed: Oct. 25, 2023

(65) Prior Publication Data

US 2024/0194717 A1 Jun. 13, 2024

(30) Foreign Application Priority Data

Dec. 9, 2022 (KR) ........................ 10-2022-0171885

(51) Int. Cl.
*H10F 39/00* (2025.01)
*H10F 39/18* (2025.01)

(52) U.S. Cl.
CPC ......... *H10F 39/811* (2025.01); *H10F 39/807* (2025.01); *H10F 39/809* (2025.01); *H10F 39/182* (2025.01)

(58) Field of Classification Search
CPC .... H10F 39/811; H10F 39/807; H10F 39/809; H10F 39/182; H10F 39/014; H10F 39/199; H10F 39/12; H10F 39/8037; H10F 39/8023; H10F 39/803; H04N 25/70; H04N 25/77
See application file for complete search history.

(56) References Cited

U.S. PATENT DOCUMENTS

| | | | | |
|---|---|---|---|---|
| 9,202,830 | B2 | 12/2015 | Nishihara et al. | |
| 10,777,598 | B2 | 9/2020 | Miyazawa et al. | |
| 12,336,315 | B2 * | 6/2025 | Cho | H10F 39/8037 |
| 2009/0184349 | A1 * | 7/2009 | Dungan | H10F 39/813 257/292 |
| 2011/0096215 | A1 * | 4/2011 | Choi | H01L 21/76898 257/E31.085 |

(Continued)

FOREIGN PATENT DOCUMENTS

| | | | |
|---|---|---|---|
| JP | 2021-082803 | A | 5/2021 |
| KR | 10-2011-0079325 | A | 7/2011 |

(Continued)

OTHER PUBLICATIONS

Examination Report received for related Korean Patent Application No. 1020220171885 dated Apr. 6, 2026.

*Primary Examiner* — Bitew A Dinke
(74) *Attorney, Agent, or Firm* — Harness, Dickey & Pierce, P.L.C.

(57) ABSTRACT

An image sensor includes a photoelectric conversion element in a first semiconductor substrate, a second semiconductor substrate on the first semiconductor substrate, a source follower transistor on the second semiconductor substrate, and a through-plug penetrating the second semiconductor substrate. The through-plug electrically connects the photoelectric conversion element to the source follower transistor. A source terminal of the source follower transistor is electrically connected to the second semiconductor substrate.

18 Claims, 18 Drawing Sheets

(56) References Cited

U.S. PATENT DOCUMENTS

2011/0155893 A1* 6/2011 Endo ..................... H10F 39/809 257/292
2014/0042299 A1* 2/2014 Wan ..................... H10F 39/018 438/60
2016/0358967 A1* 12/2016 Madurawe ............ H10F 39/199
2018/0114808 A1* 4/2018 Endo ..................... H10F 39/809
2020/0092509 A1* 3/2020 Jung .................... H04N 25/771
2020/0266229 A1 8/2020 Takahashi et al.
2021/0313381 A1* 10/2021 Murata ................. H10F 39/813
2021/0400224 A1* 12/2021 Gocho ................... H04N 25/78
2022/0006968 A1 1/2022 Yamashita
2022/0059595 A1 2/2022 Honjo
2022/0077215 A1 3/2022 Horikoshi
2022/0208823 A1* 6/2022 Yoshida .............. H01L 21/3205
2022/0302198 A1* 9/2022 Kang ...................... H10F 39/18
2022/0367536 A1* 11/2022 Saka ................. H10F 39/80373
2022/0384207 A1 12/2022 Haneda et al.
2023/0053000 A1* 2/2023 Murata ................... H10F 39/12
2023/0139176 A1* 5/2023 Yokoyama ............ H10F 39/813 348/308
2023/0254608 A1* 8/2023 Yamada .............. H10F 39/8037 250/208.1
2024/0006431 A1* 1/2024 Machida ............... H10F 39/807
2024/0006448 A1* 1/2024 Mochizuki ............ H10F 39/809
2024/0006452 A1* 1/2024 Maeda .................. H10F 39/811
2024/0030261 A1* 1/2024 Hsu ....................... H10F 39/014
2024/0170518 A1* 5/2024 Takatsuka ........... H10F 39/8067
2025/0040284 A1* 1/2025 Haneda ................. H10F 39/811

FOREIGN PATENT DOCUMENTS

KR 20200038147 A 4/2020
WO WO-2021256142 A1 * 12/2021 ......... H10F 39/8037

* cited by examiner

IMAGE SENSOR

CROSS-REFERENCE TO RELATED APPLICATION

This U.S. non-provisional patent application claims priority under 35 U.S.C. § 119 to Korean Patent Application No. 10-2022-0171885, filed on Dec. 9, 2022, in the Korean Intellectual Property Office, the entire contents of which are hereby incorporated by reference.

FIELD

Some example embodiments of the inventive concepts relate to an image sensor, including an image sensor with improved integration density and electrical characteristics.

BACKGROUND

An image sensor may convert an optical image into electrical signals. As computer and communication industries have been developed, high-performance image sensors have been increasingly demanded in various fields such as a digital camera, a camcorder, a personal communication system (PCS), a game console, a security camera, and a medical micro camera.

Image sensors may be categorized as any one of charge coupled device (CCD) image sensors and complementary metal-oxide-semiconductor (CMOS) image sensors. The CMOS image sensor may be simply driven and may be realized as a single chip on which a signal processing circuit and an image sensing part are integrated, and thus a size of the CMOS image sensor may be reduced. In addition, the CMOS image sensor may have very low power consumption so as to be easily applied to a product having a limited battery capacity. Furthermore, the CMOS image sensor may be manufactured using a CMOS process technique, thereby reducing a manufacturing cost of the CMOS image sensor. As a result, the CMOS image sensor may have high resolution by the development of the CMOS process technique, and thus the CMOS image sensor is widely used in various fields.

SUMMARY

Some example embodiments of the inventive concepts may provide an image sensor with improved integration density and electrical characteristics.

In an example embodiment, an image sensor includes a photoelectric conversion element in a first semiconductor substrate, a second semiconductor substrate on the first semiconductor substrate, a source follower transistor on the second semiconductor substrate, and a through-plug penetrating the second semiconductor substrate, the through-plug electrically connecting the photoelectric conversion element to the source follower transistor, wherein a source terminal of the source follower transistor is electrically connected to the second semiconductor substrate.

In an example embodiment, an image sensor includes a first semiconductor substrate including a plurality of pixel regions, each of the plurality of pixel regions including a photoelectric conversion region and a floating diffusion region, a second semiconductor substrate on the first semiconductor substrate. the second semiconductor substrate including a first well region having a first conductivity type, and a source follower transistor on the second semiconductor substrate. The source follower transistor includes a source follower gate on the first well region of the second semiconductor substrate, and the source follower transistor includes a source region and a drain region each having a second conductivity type, the source region and the drain region each in the first well region at multiple sides of the source follower gate. The image sensor includes a through-plug penetrating the second semiconductor substrate, the through-plug electrically connecting the floating diffusion region to the source follower gate, a first pickup dopant region having the first conductivity type, the first pickup dopant region in the first well region of the second semiconductor substrate, and a first connection line connecting the source region of the source follower transistor to the first pickup dopant region.

In an example embodiment, an image sensor includes a photoelectric conversion circuit layer comprising photoelectric conversion elements in a first semiconductor substrate, a pixel circuit layer comprising pixel transistors on a second semiconductor substrate, and a logic circuit layer comprising logic circuits on a third semiconductor substrate, the logic circuits connected to the pixel transistors. The pixel circuit layer comprises an isolation structure in the second semiconductor substrate to isolate a first well region and a second well region from each other, the first well region and the second well region having a first conductivity type, a source follower transistor on the first well region, a reset transistor on the second well region, a first pickup dopant region having the first conductivity type, the first pickup dopant region in the first well region, a second pickup dopant region having the first conductivity type, the second pickup dopant region in the second well region, a through-plug penetrating the first well region of the second semiconductor substrate, the through-plug electrically connecting at least one of the photoelectric conversion elements to a gate terminal of the source follower transistor, a through-insulating pattern penetrating the first well region and surrounding a side surface of the through-plug, and a first connection line electrically connecting a source terminal of the source follower transistor to the first pickup dopant region.

DETAILED DESCRIPTION

Some example embodiments of the inventive concepts will now be described more fully with reference to the accompanying drawings.

Figure 1:
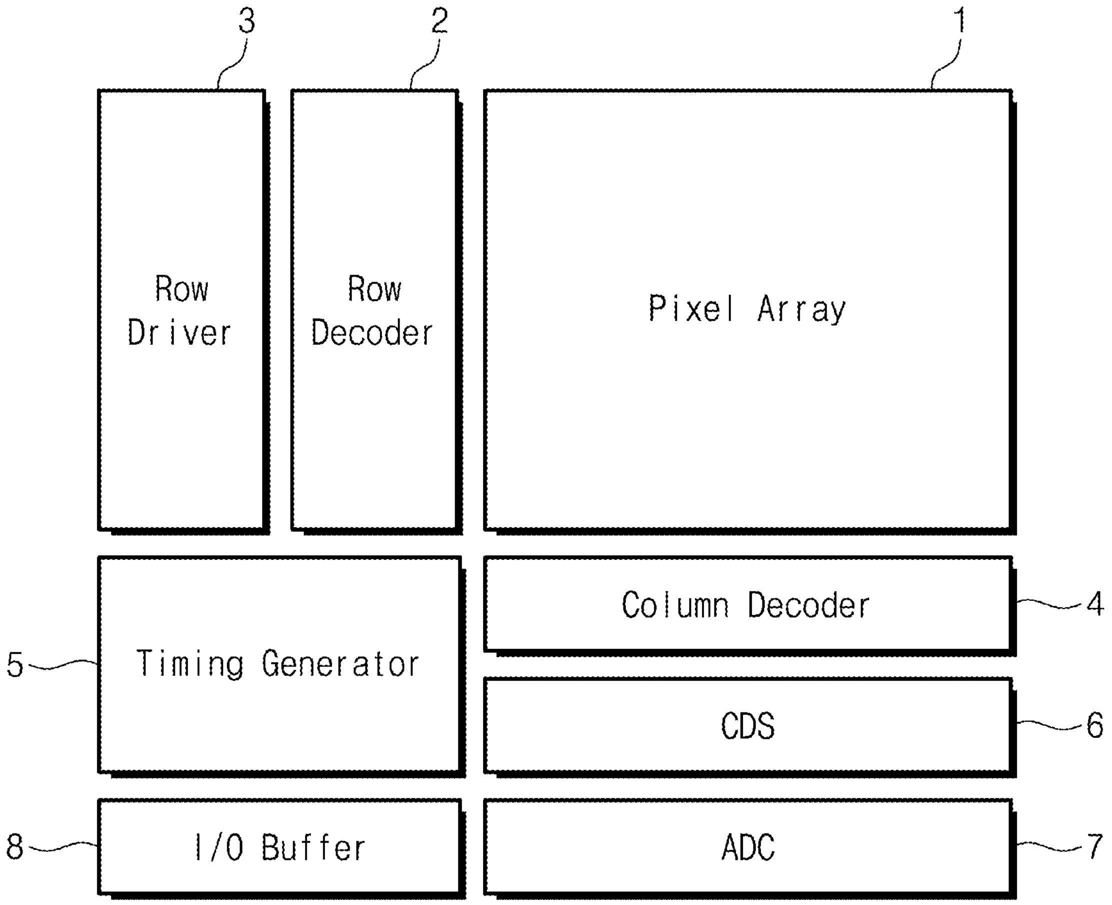
FIG. 1 is a block diagram illustrating an image sensor according to some example embodiments of the inventive concepts.

FIG. 1 is a block diagram illustrating an image sensor according to some example embodiments of the inventive concepts.

Referring to FIG. 1, an image sensor may include a pixel array 1, a row decoder 2, a row driver 3, a column decoder 4, a timing generator 5, a correlated double sampler (CDS) 6, an analog-to-digital converter (ADC) 7, and an input/output buffer (I/O buffer) 8.

The pixel array 1 may include a plurality of unit pixels arranged along rows and columns and may convert light incident to the unit pixels into electrical signals. The pixel array 1 may be driven by a plurality of driving signals (e.g., a selection signal, a reset signal and a transfer signal) provided from the row decoder 2.

The row decoder 2 may provide the driving signals to the unit pixels of each row. In addition, electrical signals converted in the pixel array 1 may be provided to the correlated double sampler 6 in response to the driving signals.

The row driver 3 may provide the plurality of driving signals for driving the plurality of unit pixels to the pixel array 1, depending on results decoded in the row decoder 2. In the event that the unit pixels are arranged in a matrix form, the driving signals may be provided in the unit of rows.

The timing generator 5 may control the row and column decoders 2 and 4, the correlated double sampler 6, the analog-to-digital converter 7, and the I/O buffer 8 and may supply control signals (e.g., a clock signal, a timing control signal, etc.) in operation thereof. The timing generator 5 may include a logic control circuit, a phase lock loop (PLL) circuit, a timing control circuit, and a communication interface circuit.

The correlated double sampler (CDS) 6 may receive electrical signals generated in the pixel array 1 and may hold and sample the received electrical signals. The correlated double sampler 6 may doubly sample a specific noise level and a signal level of the electrical signal and may output a difference level corresponding to a difference between the noise level and the signal level.

The analog-to-digital converter (ADC) 7 may convert an analog signal, which corresponds to the difference level outputted from the correlated double sampler 6, into a digital signal and may output the digital signal.

The I/O buffer 8 may latch the digital signals outputted from the analog-to-digital converter 7, and the latched signals may be sequentially outputted to an image signal processing unit (not shown), depending on results decoded in the column decoder 4.

Figure 2A:
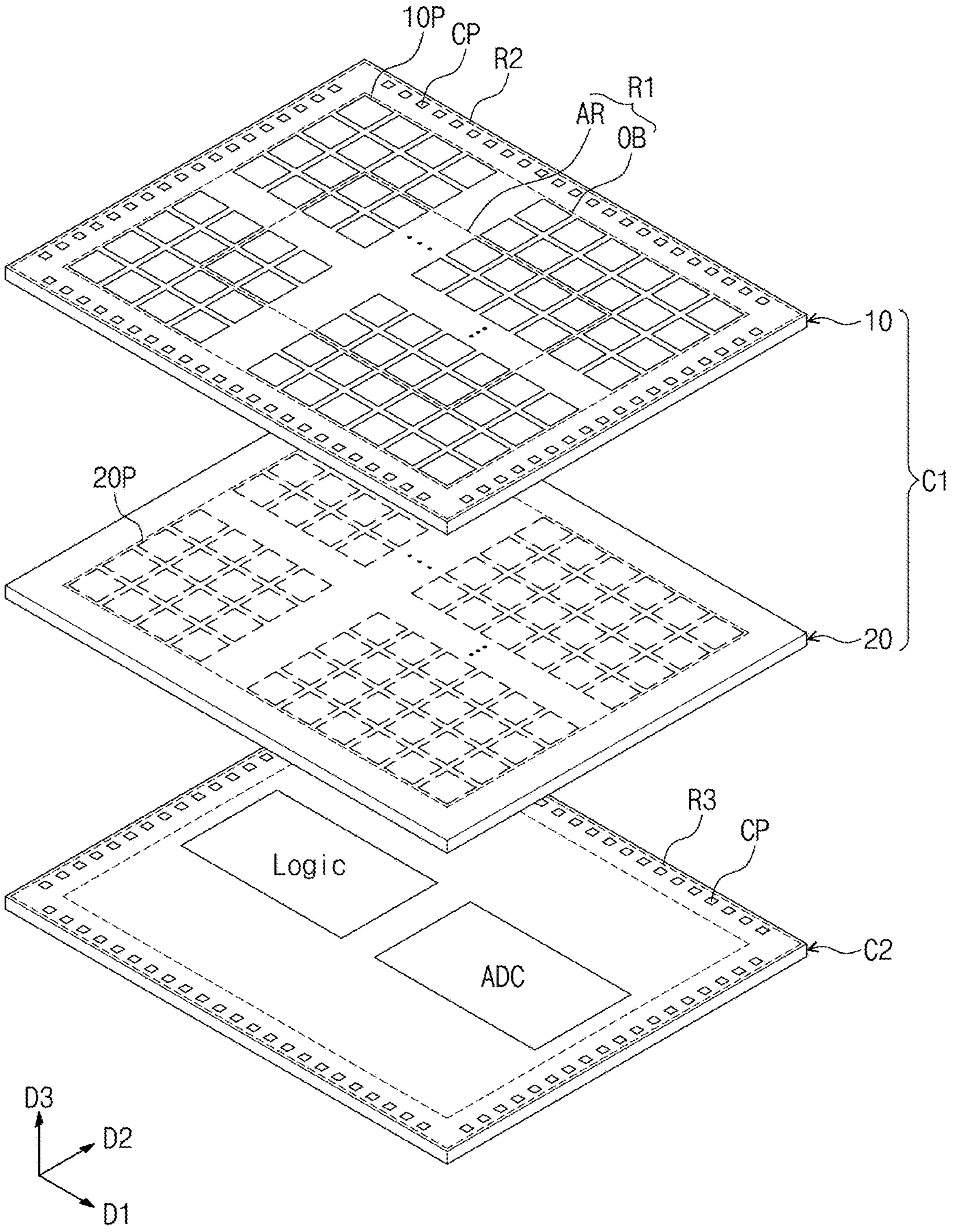
FIGS. 2A and 2B are schematic perspective views illustrating image sensors according to some example embodiments of the inventive concepts.
Figure 2B:
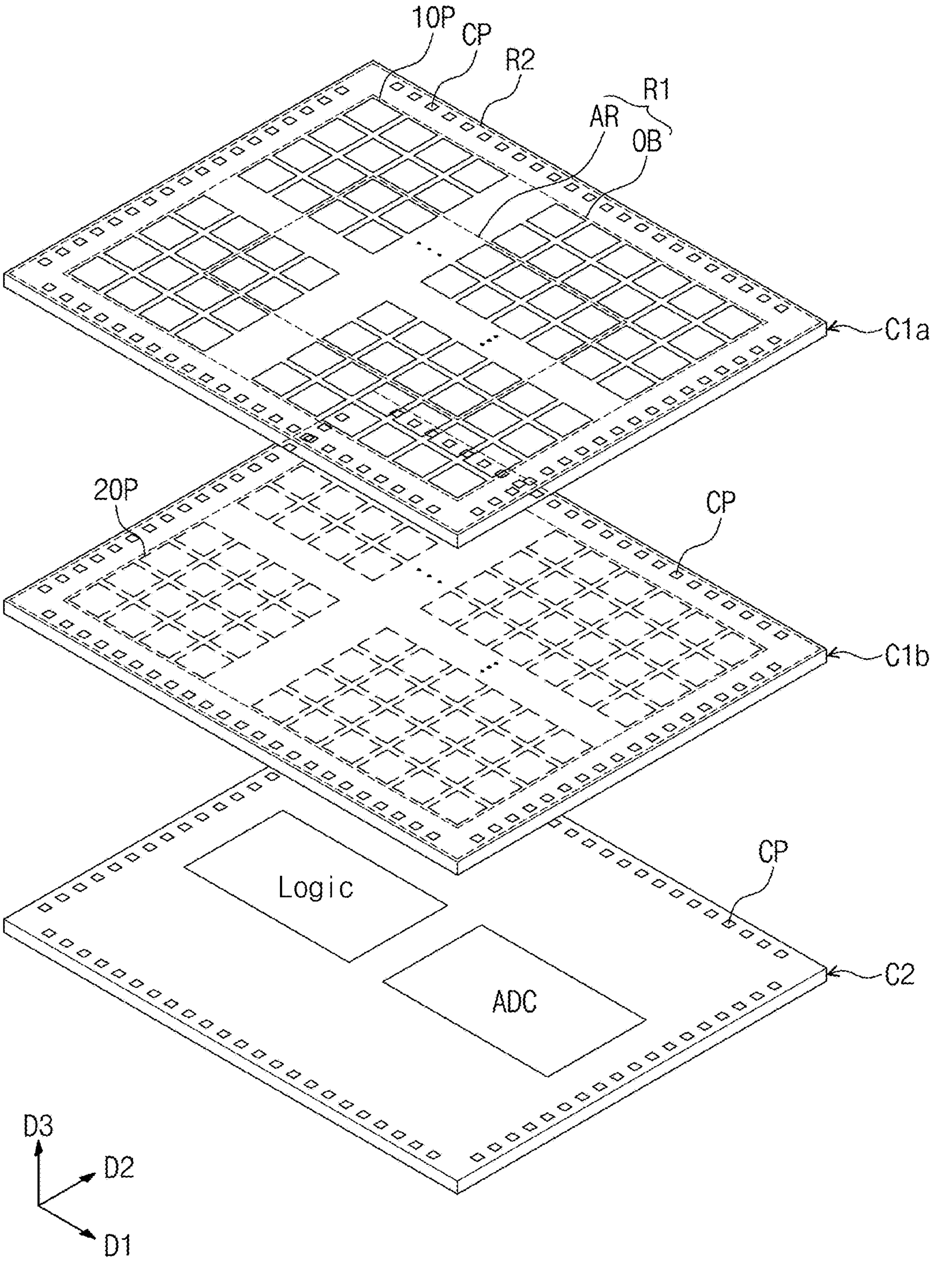

FIGS. 2A and 2B are schematic perspective views illustrating image sensors according to some example embodiments of the inventive concepts.

Referring to FIG. 2A, an image sensor may include a sensor chip C1 and a logic chip C2.

The sensor chip C1 may convert an image from an external object into electrical signals or data signals. The sensor chip C1 may include the pixel array (e.g., see the pixel array 1 of FIG. 1) described above with reference to FIG. 1. In other words, the sensor chip C1 may include a plurality of unit pixels, and each of the unit pixels may include a photoelectric conversion circuit 10P and a pixel circuit 20P, which will be described below with reference to FIGS. 3A, 3B and 3C.

The sensor chip C1 may include a pixel array region R1 and a pad region R2. The pixel array region R1 may include the plurality of unit pixels two-dimensionally arranged in a first direction D1 and a second direction D2 which intersect each other. An electrical signal generated by incident light may be outputted from each of the unit pixels of the pixel array region R1.

The pixel array region R1 may include a light-receiving region AR and a light-blocking region OB. The light-blocking region OB may surround the light-receiving region AR when viewed in a plan view. In other words, the light-blocking region OB may be disposed at top, bottom, left and right sides of the light-receiving region AR when viewed in a plan view. Reference pixels to which light is not incident may be provided in the light-blocking region OB, and magnitudes of electrical signals sensed from the unit pixels may be calculated by comparing the amount of reference charges generated from the reference pixels with the amount of charges sensed from the unit pixels of the light-receiving region AR.

A plurality of conductive pads CP used to input/output control signals and photoelectric signals may be disposed in the pad region R2. The pad region R2 may surround the pixel array region R1 in a plan view to easily realize electrical connection with an external device. The conductive pads CP may be used to input/output electrical signals generated from the unit pixels to the external device.

The sensor chip C1 may include a photoelectric conversion circuit layer 10, a pixel circuit layer 20, and a light-transmitting layer (not shown). In a vertical view, the photoelectric conversion circuit layer 10 may be disposed between the pixel circuit layer 20 and the light-transmitting layer. In addition, the pixel circuit layer 20 may be adjacent to the logic chip C2.

In detail, the photoelectric conversion circuit layer 10 may include the photoelectric conversion circuits 10P of the plurality of unit pixels. The photoelectric conversion circuits 10P may be two-dimensionally arranged in the first and second directions D1 and D2 intersecting each other.

The pixel circuit layer 20 may include the pixel circuits 20P of the plurality of unit pixels. The pixel circuits 20P may be provided to correspond to the photoelectric conversion circuits 10P, respectively.

The logic chip C2 may include logic circuits (e.g., see elements 2, 3, 4, 5, 6, 7 and 8 of FIG. 1), a power circuit, an input/output interface, and/or an image signal processor. In other words, the logic chip C2 may include other components except the pixel array 1 in the image sensor of FIG. 1. For example, the logic chip C2 may include the row decoder 2, the row driver 3, the column decoder 4, the timing generator 5, the correlated double sampler 6, the analog-to-digital converter 7, and the I/O buffer 8.

The logic chip C2 may include a logic pad region R3 corresponding to the pad region R2 of the sensor chip C1. A plurality of conductive pads CP used to input/output control signals may be disposed in the logic pad region R3. The conductive pads CP of the sensor chip C1 may be electrically connected to the conductive pads CP of the logic chip C2. The logic chip C2 may be bonded to the sensor chip C1 so as to be adjacent to the pixel circuit layer 20 of the sensor chip C1.

Referring to FIG. 2B, an image sensor may include a first chip C1*a* including the photoelectric conversion circuits 10P of the plurality of unit pixels, a second chip C1*b* including the pixel circuits 20P of the plurality of unit pixels, and the logic chip C2.

The first chip C1*a* may include the pixel array region R1 and the pad region R2, and the pixel array region R1 may include the light-receiving region AR and the light-blocking region OB. The first chip C1*a* may include the photoelectric conversion circuits 10P of the plurality of unit pixels. The photoelectric conversion circuits 10P may be two-dimensionally arranged in the first and second directions D1 and D2 intersecting each other in the pixel array region R1.

The second chip C1*b* may include the pixel circuits 20P of the plurality of unit pixels. The pixel circuits 20P may be provided to correspond to the photoelectric conversion circuits 10P, respectively. The second chip C1*b* may include conductive pads CP corresponding to the conductive pads CP of the first chip C1*a*. The conductive pads CP of the first chip C1*a* may be electrically connected to the conductive pads CP of the second chip C1*b*.

As described above, the logic chip C2 may include the logic circuits (e.g., see elements 2, 3, 4, 5, 6, 7 and 8 of FIG. 1), the power circuit, the input/output interface, and/or the image signal processor. The conductive pads CP of the logic chip C2 may be electrically connected to the conductive pads CP of the second chip C1*b*.

Figure 3A:
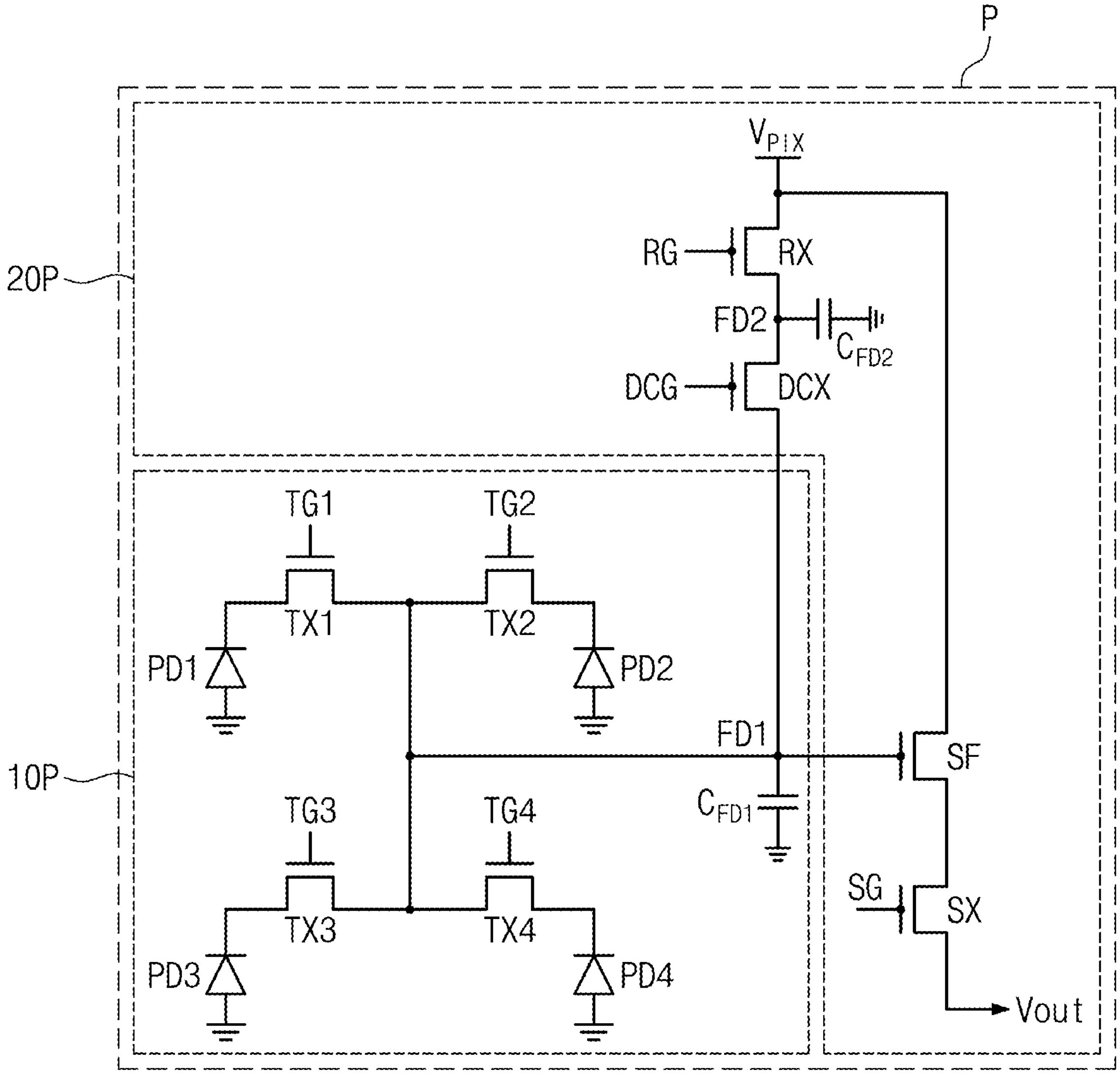
FIGS. 3A, 3B and 3C are circuit diagrams illustrating unit pixels of pixel arrays according to some example embodiments of the inventive concepts.
Figure 3B:
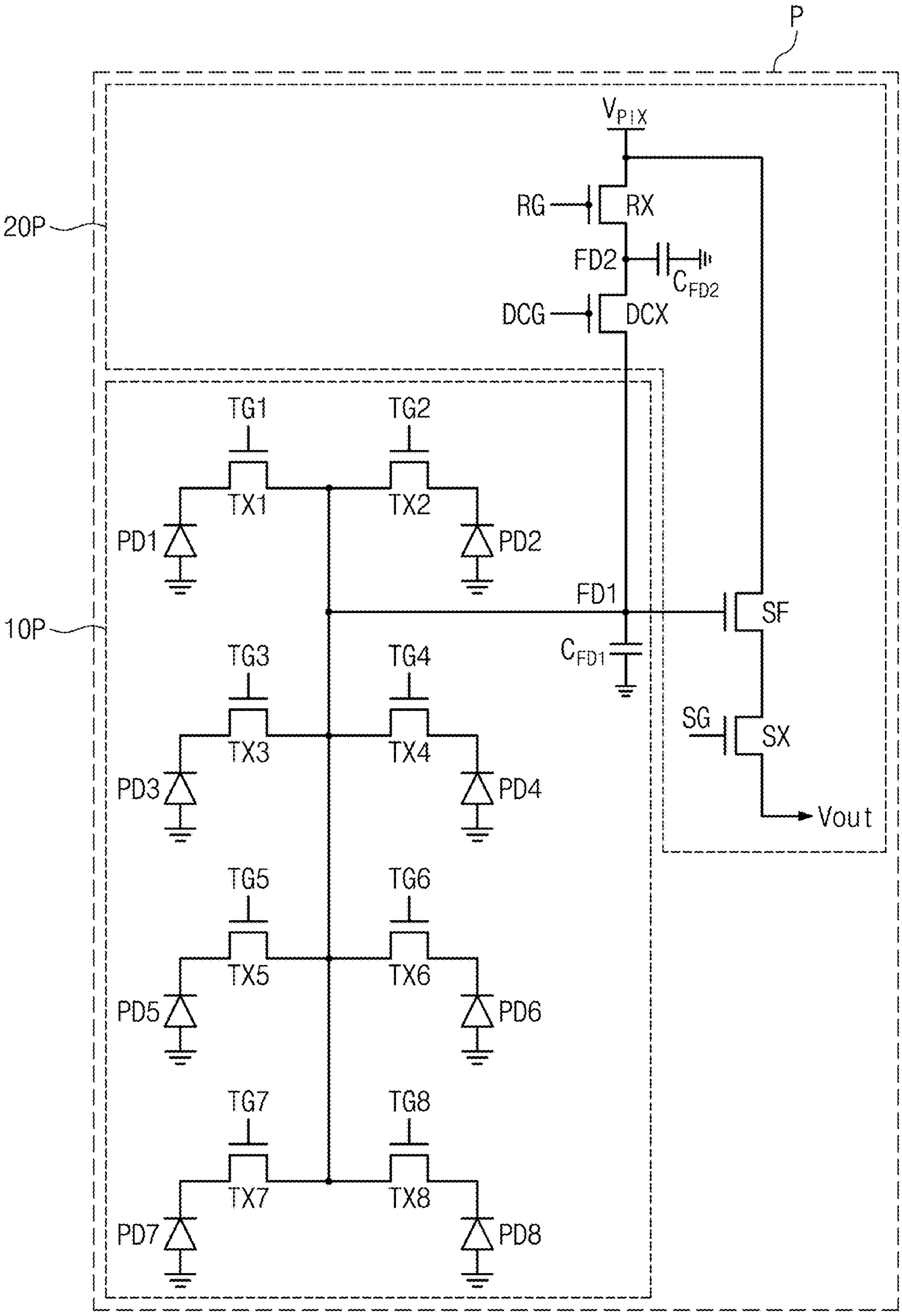
Figure 3C:
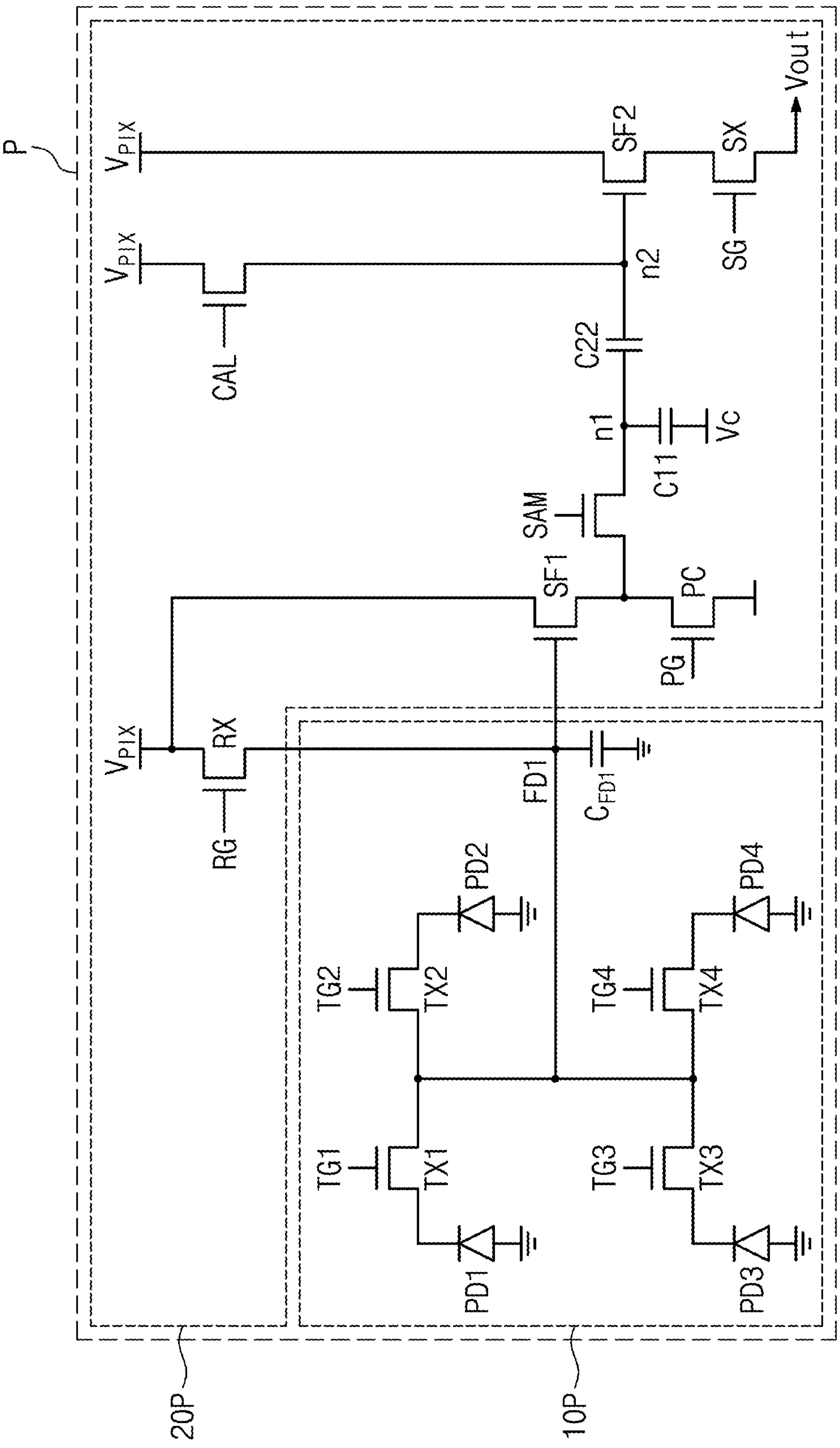

FIGS. 3A, 3B and 3C are circuit diagrams illustrating unit pixels of pixel arrays according to some example embodiments of the inventive concepts.

Referring to FIG. 3A, a unit pixel P may include a photoelectric conversion circuit 10P and a pixel circuit 20P.

The photoelectric conversion circuit 10P may include first, second, third and fourth photoelectric conversion elements PD1, PD2, PD3 and PD4, first, second, third and fourth transfer transistors TX1, TX2, TX3 and TX4, and a first floating diffusion region FD1.

The first to fourth transfer transistors TX1, TX2, TX3 and TX4 may share the first floating diffusion region FD1. Transfer gate electrodes of the first to fourth transfer transistors TX1, TX2, TX3 and TX4 may be controlled by first to fourth transfer signals TG1, TG2, TG3 and TG4.

The pixel circuit 20P may include four pixel transistors RX, DCX, SF and SX and a second floating diffusion region FD2. The pixel circuit 20P may include a reset transistor RX, a source follower transistor SF, and a selection transistor SX. The pixel circuit 20P may further include a dual conversion gain transistor DCX, and the second floating diffusion region FD2.

Each of the unit pixels P includes four pixel transistors RX, DCX, SF and SX in the present example embodiments, but other example embodiments of the inventive concepts are not limited thereto (e.g., the number of the pixel transistors in each of the unit pixels P may be changed).

The first and second photoelectric conversion elements PD1 and PD2 may generate and accumulate charges corresponding to incident light. For example, each of the first and second photoelectric conversion elements PD1 and PD2 may include a photodiode, a photo transistor, a photo gate, a pinned photodiode (PPD), or a combination thereof, but example embodiments are not limited thereto.

The first and second transfer transistors TX1 and TX2 may transfer charges accumulated in the first and second photoelectric conversion elements PD1 and PD2 into the first floating diffusion region FD1. The first and second transfer transistors TX1 and TX2 may be controlled by the first and second transfer signals TG1 and TG2. The first and second transfer transistors TX1 and TX2 may share the first floating diffusion region FD1.

The first floating diffusion region FD1 may receive and cumulatively store charges generated in the first or second photoelectric conversion element PD1 or PD2. The source follower transistor SF may be controlled depending on the amount of photocharges accumulated in the first floating diffusion region FD1.

The reset transistor RX may periodically reset charges accumulated in the first floating diffusion region FD1 and the second floating diffusion region FD2 by a reset signal RG applied to a reset gate electrode. In detail, a drain terminal of the reset transistor RX may be connected to the dual conversion gain transistor DCX, and a source terminal of the reset transistor RX may be connected to a pixel power voltage VPIX. When the reset transistor RX and the dual conversion gain transistor DCX are turned-on, the pixel power voltage VPIX may be transmitted to the first and second floating diffusion regions FD1 and FD2. Thus, the charges accumulated in the first and second floating diffusion regions FD1 and FD2 may be discharged to reset the first and second floating diffusion regions FD1 and FD2.

The dual conversion gain transistor DCX may be connected between the first floating diffusion region FD1 and the second floating diffusion region FD2. The dual conversion gain transistor DCX may be connected in series to the reset transistor RX through the second floating diffusion region FD2. In other words, the dual conversion gain transistor DCX may be connected between the first floating diffusion region FD1 and the reset transistor RX. The dual conversion gain transistor DCX may change a first capacitance CFD1 of the first floating diffusion region FD1 in response to a dual conversion gain control signal DCG, and thus a conversion gain of the unit pixel P may be changed.

In detail, when an image is obtained, strong light and weak light may be incident to the pixel array at the same time. Thus, the conversion gain of each of the unit pixels P may be changed depending on the intensity of incident light. By operation of the dual conversion gain transistor DCX, different conversion gains may be provided in a first conversion gain mode (e.g., a high illumination mode) and a second conversion gain mode (e.g., a low illumination mode).

When the dual conversion gain transistor DCX is turned-off, a capacitance of the first floating diffusion region FD1 may correspond to the first capacitance CFD1. In other words, when the dual conversion gain transistor DCX is turned-off, the unit pixel P may have a first conversion gain.

When the dual conversion gain transistor DCX is turned-on, the first floating diffusion region FD1 may be connected to the second floating diffusion region FD2, and thus a capacitance in the first and second floating diffusion regions FD1 and FD2 may be a sum (CFD1+CFD2) of first and second capacitances CFD1 and CFD2. In other words, when the dual conversion gain transistor DCX is turned-on, the unit pixel P may have a second conversion gain less than the first conversion gain.

In other words, when the dual conversion gain transistor DCX is turned-on, the capacitance of the first or second floating diffusion region FD1 or FD2 may be increased to reduce the conversion gain, and when the dual conversion gain transistor DCX is turned-off, the capacitance of the first floating diffusion region FD1 may be reduced to increase the conversion gain.

The source follower transistor SF may be a source follower buffer amplifier for generating a source-drain current in proportion to the amount of charges of the first floating diffusion region FD1 inputted into a source follower gate electrode. The source follower transistor SF may amplify a change in electric potential of the first floating diffusion region FD1 and may output the amplified signal to an output line Vout through the selection transistor SX. A source terminal of the source follower transistor SF may be connected to the pixel power voltage VPIX, and a drain terminal of the source follower transistor SF may be connected to a source terminal of the selection transistor SX.

The selection transistor SX may select the unit pixels P to be read in the unit of rows. When the selection transistor SX is turned-on by a selection signal SG applied to a selection gate electrode, an electrical signal outputted at the drain terminal of the source follower transistor SF may be outputted to the output line Vout.

Referring to FIG. 3B, a unit pixel P may include a photoelectric conversion circuit 10P and a pixel circuit 20P as described with reference to FIG. 3A, and the photoelectric conversion circuit 10P may include first to eighth photoelectric conversion elements PD1 to PD8, first to eighth transfer transistors TX1 to TX8, and a first floating diffusion region FD1.

The first to eighth transfer transistors TX1 to TX8 may share the first floating diffusion region FD1. Transfer gate electrodes of the first to eighth transfer transistors TX1 to TX8 may be controlled by first to eighth transfer signals TG1 to TG8.

The pixel circuit 20P may include a reset transistor RX, a source follower transistor SF, a selection transistor SX, a dual conversion gain transistor DCX, and a second floating diffusion region FD2, as described with reference to FIG. 3A.

According to the example embodiment of FIG. 3C, a unit pixel P may have an in-pixel correlated double sampling (CDS) structure. In addition, the unit pixel P may include a photoelectric conversion circuit 10P and a pixel circuit 20P, as described with reference to FIG. 3A.

The photoelectric conversion circuit 10P may include first to fourth photoelectric conversion elements PD1 to PD4, first to fourth transfer transistors TX1 to TX4, and a floating diffusion region FD1 connected in common to the first to fourth transfer transistors TX1 to TX4, as described with reference to FIG. 3A. Alternatively, the photoelectric conversion circuit 10P may include eight photoelectric conversion elements and eight transfer transistors, as described with reference to FIG. 3B.

The pixel circuit 20P may include a reset transistor RX, a first source follower transistor SF1, a precharge transistor PC, a sampling transistor SAM, a calibration transistor CAL, a second source follower transistor SF2, a selection transistor SX, a first capacitor C11, and a second capacitor C22.

The reset transistor RX may be controlled by a reset signal RG inputted to its gate electrode. A drain of the reset transistor RX may be connected to the floating diffusion region FD1, and a source of the reset transistor RX may be connected to a pixel power voltage VPIX. When the reset transistor RX is turned-on by the reset signal RG, the pixel power voltage VPIX connected to the source of the reset transistor RX may be transmitted to the floating diffusion region FD1. In other words, when the reset transistor RX is turned-on, photocharges accumulated in the floating diffusion region FD1 may be discharged to reset the floating diffusion region FD1.

The first source follower transistor SF1 may be a source follower buffer amplifier for generating a source-drain current in proportion to the amount of photocharges inputted to its gate electrode. A drain of the first source follower transistor SF1 may be connected to the pixel power voltage VPIX, and a source of the first source follower transistor SF1 may be connected to a source of the precharge transistor PC and a source of the sampling transistor SAM.

The sampling transistor SAM may be connected between the source of the first source follower transistor SF1 and a first node n1. First electrodes of the first and second capacitors C11 and C22 may be connected to the first node n1. A capacitor voltage Vc may be applied to a second electrode of the first capacitor C11, and a second electrode of the second capacitor C22 may be connected to a second node n2.

The precharge transistor PC may precharge the first capacitor C11 and the second capacitor C22 to allow the first source follower transistor SF1 to sample a new voltage.

A drain of the calibration transistor CAL may be connected to the pixel power voltage VPIx, and a source of the calibration transistor CAL may be connected to the second node n2. The second node n2 may be calibrated by the calibration transistor CAL.

A gate electrode of the second source follower transistor SF2 may be connected to the second node n2. A drain of the second source follower transistor SF2 may be connected to the pixel power voltage VPIX, and a source of the second source follower transistor SF2 may be connected to a drain of the selection transistor SX. The second source follower transistor SF2 may amplify a change in electric potential of the second node n2 and may output a pixel signal to an output line Vout through the selection transistor SX.

Figure 4:
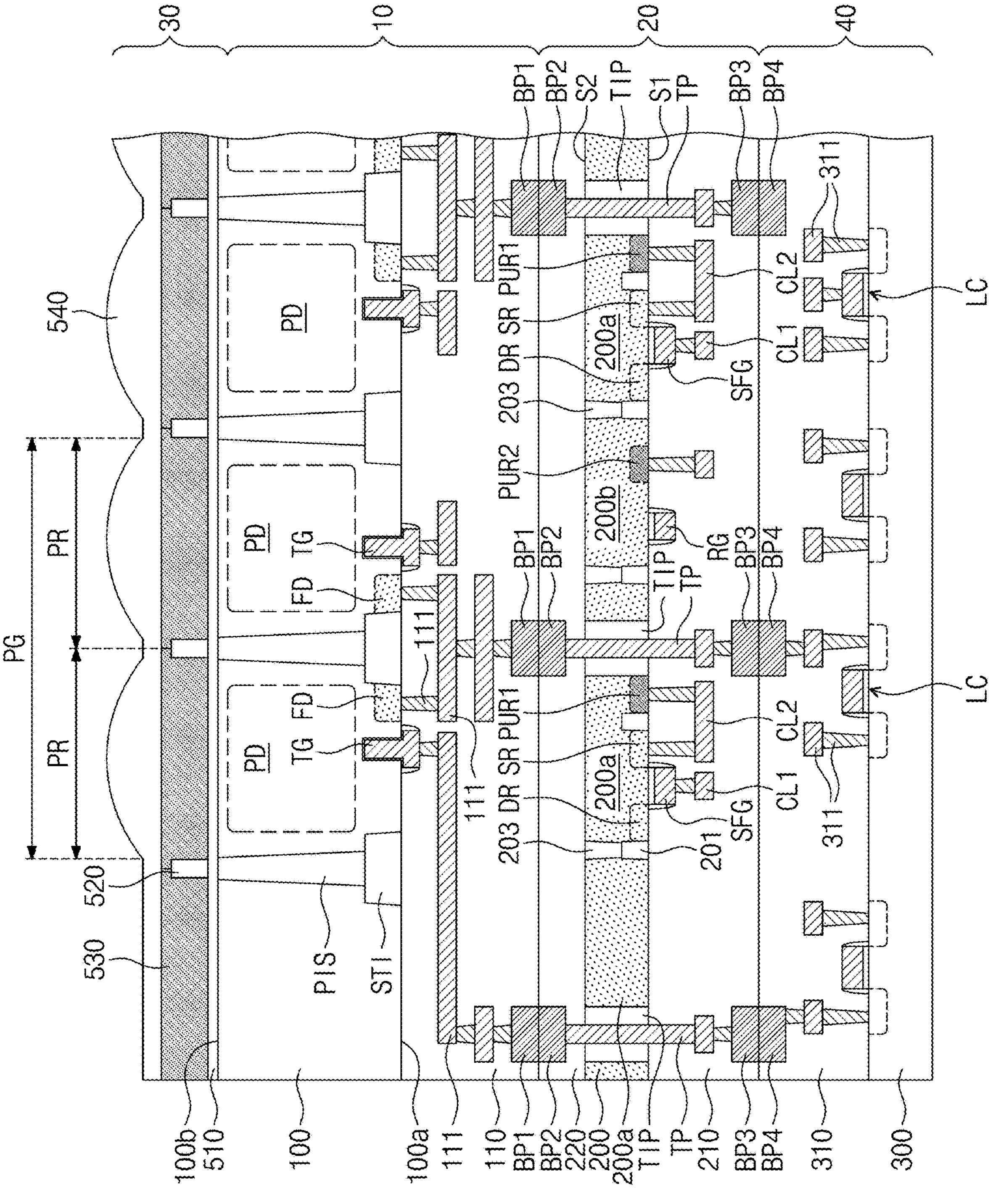
FIG. 4 is a cross-sectional view illustrating a portion of an image sensor according to some example embodiments of the inventive concepts.
Figure 5A:
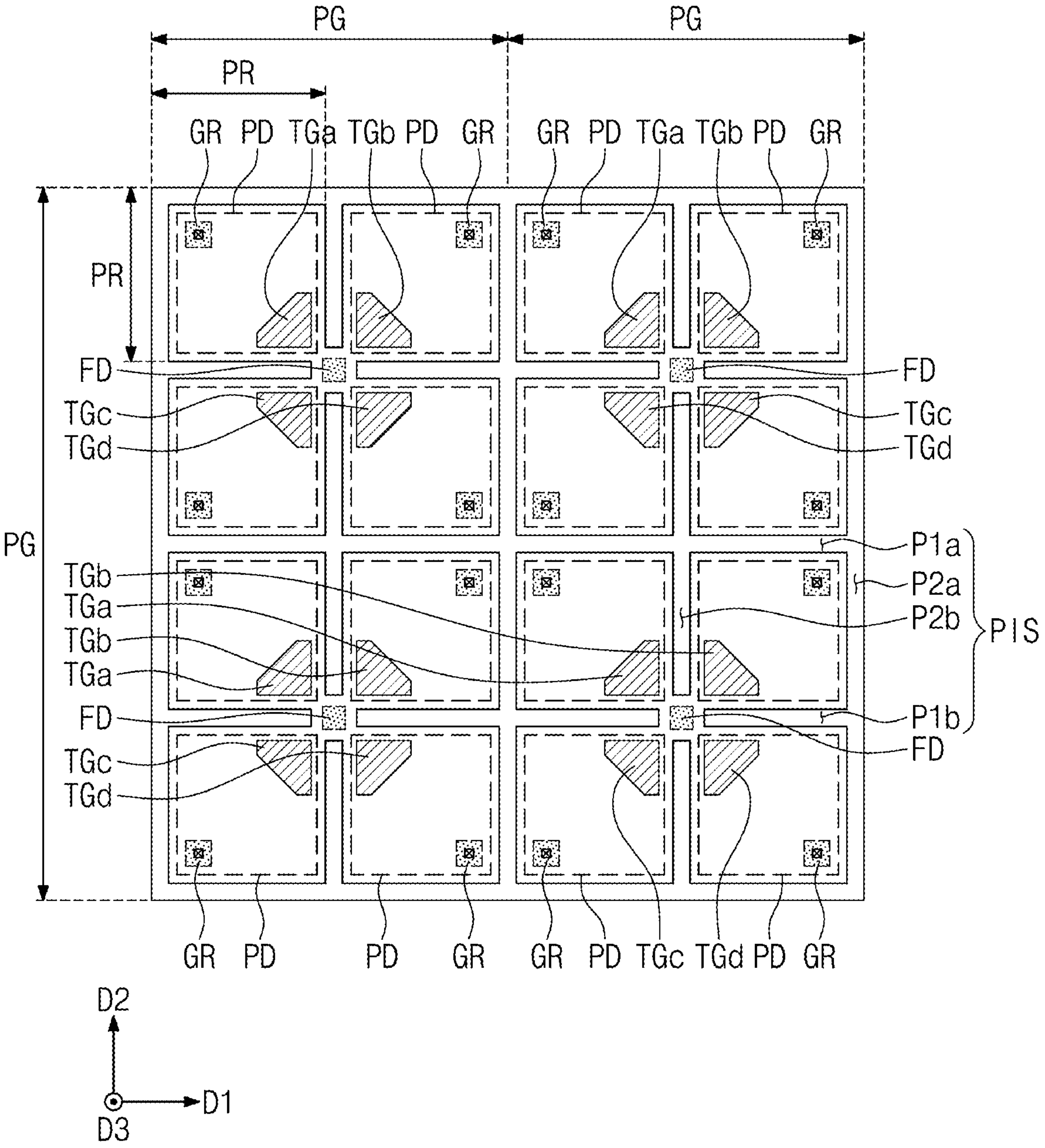
FIGS. 5A and 5B are plan views illustrating portions of photoelectric conversion circuit layers of image sensors according to some example embodiments of the inventive concepts.
Figure 5B:
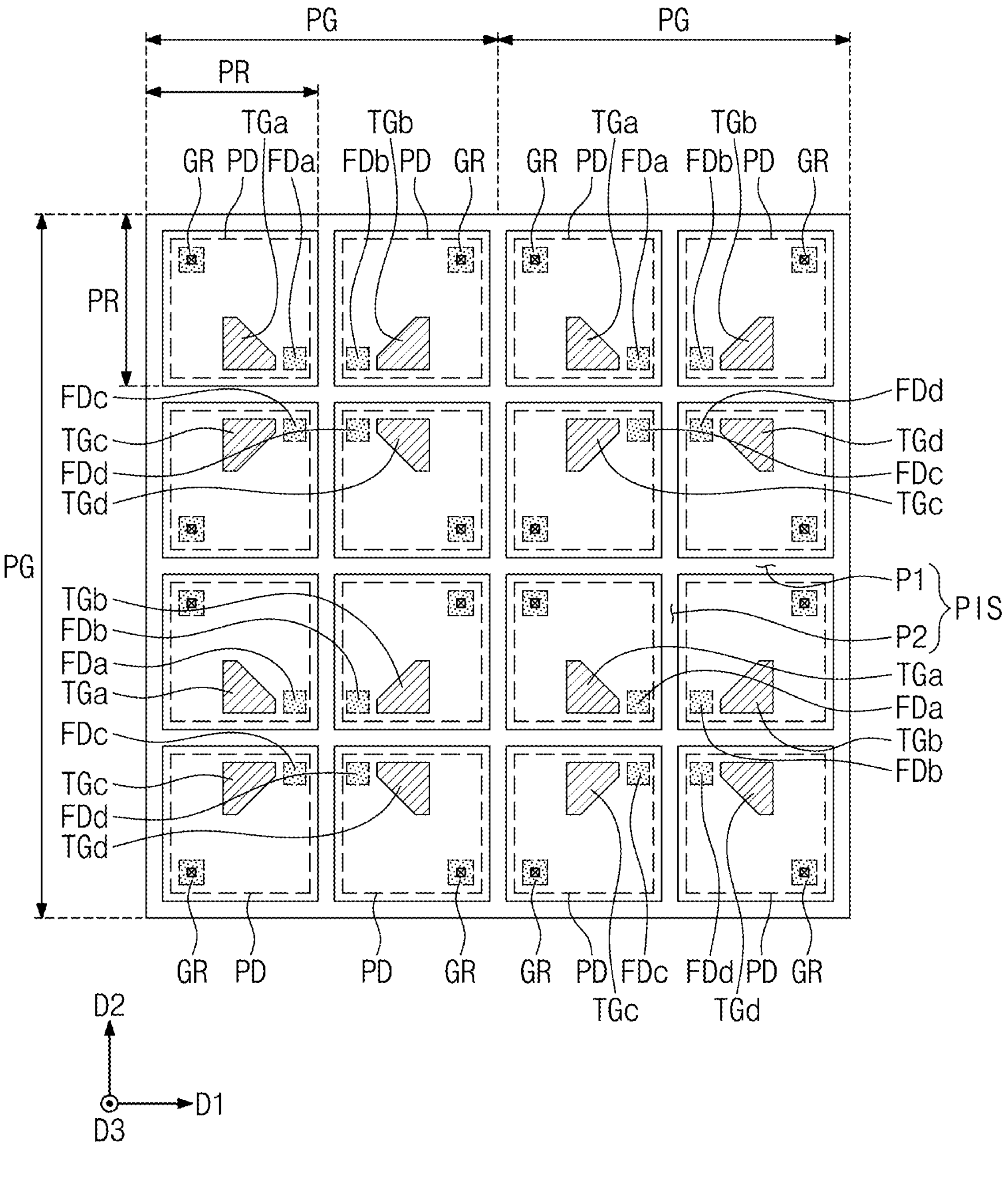
Figure 6:
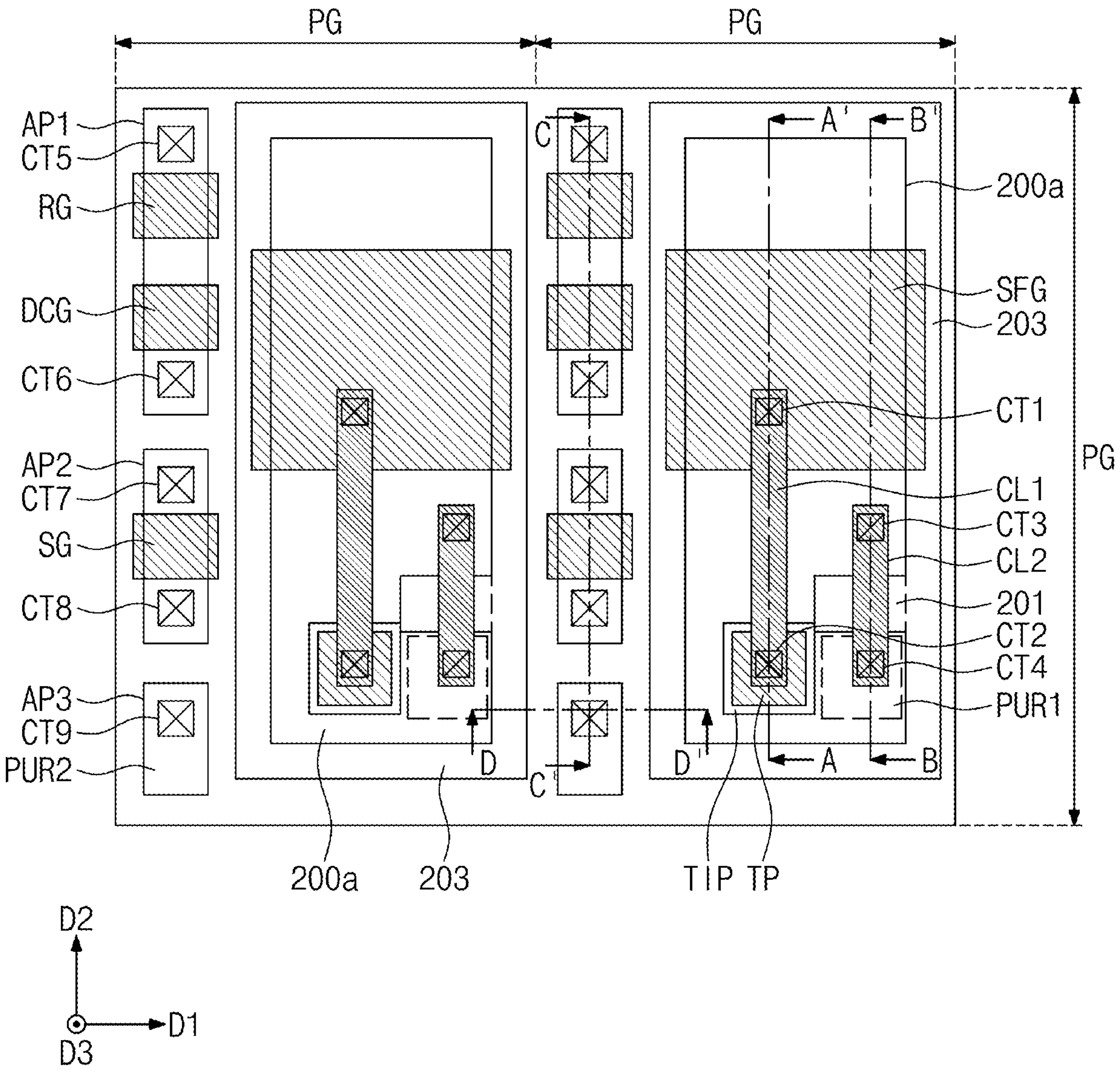
FIG. 6 is a plan view illustrating a portion of a pixel circuit layer of an image sensor according to some example embodiments of the inventive concepts.
Figure 7A:
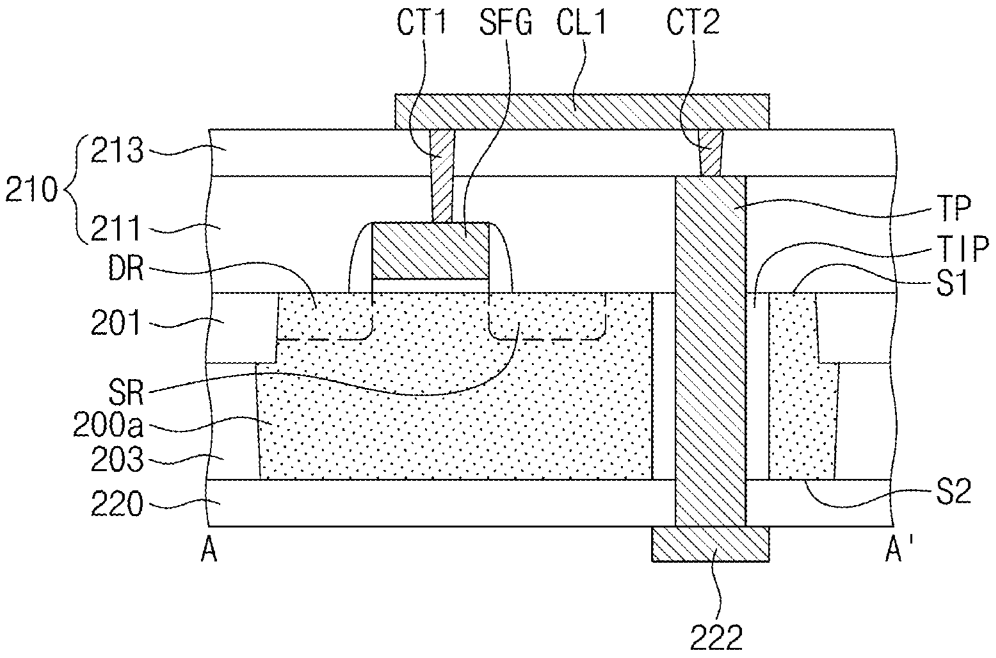
FIGS. 7A, 7B, 7C and 7D are cross-sectional views taken along lines A-A', B-B', C-C' and D-D' of FIG. 6.
Figure 7B:
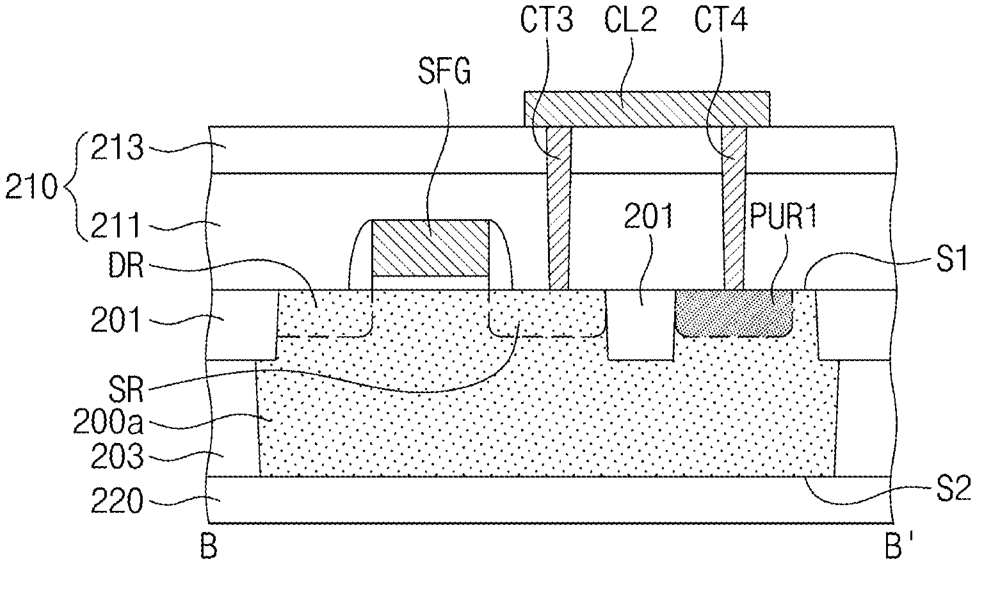
Figure 7C:
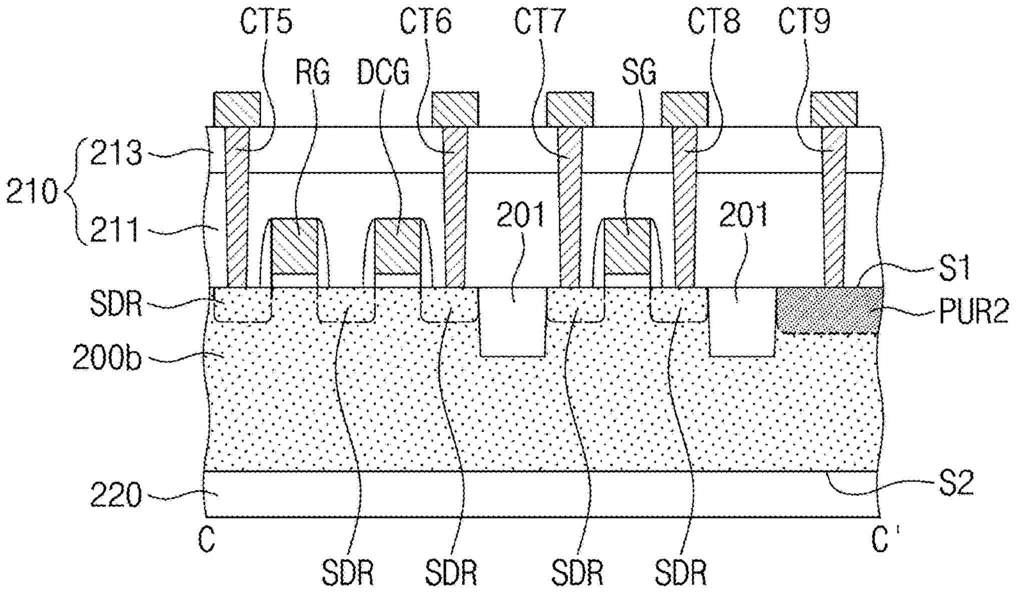
Figure 7D:
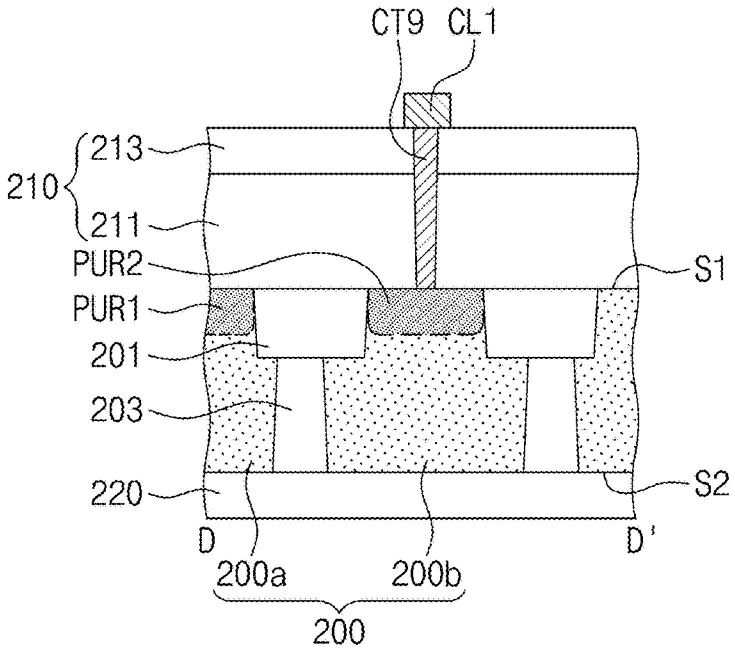

FIG. 4 is a cross-sectional view illustrating a portion of an image sensor according to some example embodiments of the inventive concepts. FIGS. 5A and 5B are plan views illustrating portions of photoelectric conversion circuit layers of image sensors according to some example embodiments of the inventive concepts. FIG. 6 is a plan view illustrating a portion of a pixel circuit layer of an image sensor according to some example embodiments of the inventive concepts. FIGS. 7A, 7B, 7C and 7D are cross-sectional views taken along lines A-A', B-B', C-C' and D-D' of FIG. 6.

Referring to FIG. 4, an image sensor according to some example embodiments of the inventive concepts may include a photoelectric conversion circuit layer 10, a pixel circuit layer 20, a light-transmitting layer 30, and a logic circuit layer 40.

The photoelectric conversion circuit layer 10 may be disposed between the pixel circuit layer 20 and the light-transmitting layer 30 in a vertical view. The photoelectric conversion circuit layer 10 may include a first semiconductor substrate 100, a pixel isolation structure PIS, a photoelectric conversion region PD, a transfer gate electrode TG, a floating diffusion region FD, and first interlayer insulating layers 110.

More particularly, referring to FIGS. 4 and 5A, the first semiconductor substrate 100 may have a first surface (e.g., a front surface) 100*a* and a second surface (e.g., a back surface) 100*b*, which are opposite to each other. The first semiconductor substrate 100 may be a substrate in which an epitaxial layer having a first conductivity type (e.g., a p-type) is formed on a bulk silicon substrate having the first conductivity type, or may be a substrate in which the p-type epitaxial layer remains by removing the bulk silicon substrate in a process of manufacturing an image sensor. Alternatively, the first semiconductor substrate 100 may be a bulk semiconductor substrate including a well having the first conductivity type.

The first semiconductor substrate 100 may include a plurality of pixel groups PG. Each of the pixel groups PG may include at least four, eight or sixteen pixel regions PR, but example embodiments are not limited thereto. In each of the pixel groups PG, the pixel regions PR may be arranged in a matrix form in a first direction D1 and a second direction D2 which intersect each other. Each of the pixel regions PR may be defined by the pixel isolation structure PIS provided in the first semiconductor substrate 100.

The pixel isolation structure PIS may be disposed in the first semiconductor substrate 100 and may vertically extend from the first surface 100*a* to the second surface 100*b* of the first semiconductor substrate 100. The pixel isolation structure PIS may completely or partially penetrate the first semiconductor substrate 100. The pixel isolation structure PIS may penetrate a portion of a device isolation layer STI. The pixel isolation structure PIS may include an isolation insulating pattern and a conductive pattern in the isolation insulating pattern.

Referring to FIG. 5A, the pixel isolation structure PIS may include first and second isolation portions P1*a* and P1*b* which are parallel to the first direction D1 and are spaced apart from each other in the second direction D2, and third and fourth isolation portions P2*a* and P2*b* which are parallel to the second direction D2 and are spaced apart from each other in the first direction D1. Here, the third and fourth isolation portions P2*a* and P2*b* may intersect the first and second isolation portions P1*a* and P1*b*. Each of the pixel regions PR may be surrounded by the first to fourth isolation portions P1*a*, P1*b*, P2*a* and P2*b* of the pixel isolation structure PIS.

In some example embodiments, portions of the second isolation portion P1*b* may be spaced apart from each other in the first direction D1 with the floating diffusion region FD interposed therebetween, and portions of the fourth isolation portion P2*b* may be spaced apart from each other in the second direction D2 with the floating diffusion region FD interposed therebetween.

Referring to FIG. 5B, the pixel isolation structure PIS may include first portions P1 extending in the first direction D1 in parallel to each other, and second portions P2 extending in the second direction D2 in parallel to each other to intersect the first portions P1. The pixel isolation structure PIS may surround each of the pixel regions PR when viewed in a plan view.

Referring continuously to FIGS. 4 and 5A, the device isolation layer STI may be disposed adjacent to the first surface 100*a* of the first semiconductor substrate 100 in each of the pixel regions PR. The device isolation layer STI may define an active portion at the first surface 100*a* of the first semiconductor substrate 100. The device isolation layer STI may be provided in a device isolation trench formed by recessing the first surface 100*a* of the first semiconductor substrate 100. The device isolation layer STI may be formed of an insulating material.

The device isolation layer STI may overlap with a portion of the pixel isolation structure PIS. For example, the device isolation layer STI may be disposed on the pixel isolation structure PIS between the pixel regions PR adjacent to each other. The device isolation layer STI may be provided between the first and third isolation portions P1*a* and P2*a* when viewed in a plan view. The device isolation layer STI may be disposed adjacent to the first surface 100*a* of the first semiconductor substrate 100.

The photoelectric conversion region PD may be provided in the first semiconductor substrate 100 of each of the pixel regions PR. The photoelectric conversion region PD may generate photocharges in proportion to an intensity of incident light. The photoelectric conversion region PD may be formed by ion-implanting dopants having a second conductivity type opposite to the first conductivity type of the first semiconductor substrate 100 into the first semiconductor substrate 100. A photodiode may be formed by a junction between the first semiconductor substrate 100 having the first conductivity type and the photoelectric conversion region PD having the second conductivity type.

In some example embodiments, a dopant concentration in a region of the photoelectric conversion region PD adjacent to the first surface 100*a* may be different from a dopant concentration in a region of the photoelectric conversion region PD adjacent to the second surface 100*b*, and thus the photoelectric conversion region PD may have a potential gradient between the first surface 100*a* and the second surface 100*b* of the first semiconductor substrate 100. For example, the photoelectric conversion region PD may include a plurality of dopant regions stacked vertically.

In each of the pixel regions PR, a transfer gate electrode TGa, TGb, TGc or TGd may be disposed on the first surface 100*a* of the first semiconductor substrate 100. The transfer gate electrode TGa, TGb, TGc or TGd may partially overlap with the photoelectric conversion region PD when viewed in a plan view. The transfer gate electrode TGa, TGb, TGc or TGd may be disposed in the first semiconductor substrate 100. The transfer gate electrode TGa, TGb, TGc or TGd may include a lower portion inserted in the first semiconductor substrate 100, and an upper portion connected to the lower portion and protruding above the first surface 100*a* of the first semiconductor substrate 100. The lower portion of the transfer gate electrode TGa, TGb, TGc or TGd may vertically penetrate a portion of the first semiconductor substrate 100. A bottom surface of the transfer gate electrode TGa, TGb, TGc or TGd may be located at a lower level than the first surface 100*a* of the first semiconductor substrate 100. A gate insulating layer may be disposed between the transfer gate electrode TGa, TGb, TGc or TGd and the first semiconductor substrate 100.

According to the embodiments of FIG. 5A, the floating diffusion region FD may be provided in common in at least four pixel regions PR. The floating diffusion region FD may be provided in the first semiconductor substrate 100 and may be adjacent to first to fourth transfer gate electrodes TGa, TGb, TGc and TGd.

The floating diffusion region FD may vertically overlap with a portion of the pixel isolation structure PIS. The floating diffusion region FD may be provided between the second and fourth isolation portions P1*b* and P2*b* of the pixel isolation structure PIS when viewed in a plan view. The floating diffusion region FD may be located away from a ground dopant region GR of each of the pixel regions PR in a diagonal direction. The floating diffusion region FD may be formed by ion-implanting dopants having the second conductivity type (e.g., an n-type) into the first semiconductor substrate 100 having the first conductivity type.

According to the example embodiment of FIG. 5B, a floating diffusion region FDa, FDb, FDc or FDd may be provided in the first semiconductor substrate 100 in each of the pixel regions PR. The floating diffusion region FDa, FDb, FDc or FDd may be disposed adjacent to the device isolation layer STI. In each of the pixel regions PR, the floating diffusion region FDa, FDb, FDc or FDd may vertically overlap with a portion of the photoelectric conversion region PD.

In each of the pixel regions PR, the ground dopant region GR may be spaced apart from a transfer gate electrode TGa, TGb, TGc or TGd and may be provided in the first semiconductor substrate 100. The ground dopant region GR may vertically overlap with a portion of the photoelectric conversion region PD. The ground dopant region GR may be doped with dopants having the same or substantially the same conductivity type (e.g., the first conductivity type) as the first semiconductor substrate 100. For example, the ground dopant region GR may be a p-type dopant region. A ground voltage may be applied to the first semiconductor substrate 100 through the ground dopant region GR.

In each of the pixel regions PR, the transfer gate electrode TGa, TGb, TGc or TGd may be disposed on the first surface 100*a* of the first semiconductor substrate 100. The transfer gate electrode TGa, TGb, TGc or TGd may partially overlap with the photoelectric conversion region PD when viewed in a plan view. The transfer gate electrode TGa, TGb, TGc or TGd may be disposed in the first semiconductor substrate 100. The transfer gate electrode TGa, TGb, TGc or TGd may include a lower portion inserted in the first semiconductor substrate 100, and an upper portion connected to the lower portion and protruding above the first surface 100*a* of the first semiconductor substrate 100. The lower portion of the transfer gate electrode TGa, TGb, TGc or TGd may vertically penetrate a portion of the first semiconductor substrate 100. A bottom surface of the transfer gate electrode TGa, TGb, TGc or TGd may be located at a different level from the first surface 100*a* of the first semiconductor substrate 100. A gate insulating layer may be disposed between the transfer gate electrode TGa, TGb, TGc or TGd and the first semiconductor substrate 100.

The first interlayer insulating layers 110 may cover the transfer gate electrodes TGa, TGb, TGc and TGd on the first surface 100*a* of the first semiconductor substrate 100. For example, the first interlayer insulating layers 110 may include silicon oxide, silicon nitride, and/or silicon oxynitride.

An interconnection structure 111 connected to the transfer gate electrodes TGa, TGb, TGc and TGd and the floating diffusion regions FD (or FDa, FDb, FDc and FDd) may be disposed in the first interlayer insulating layers 110.

According to some example embodiments, the photoelectric conversion circuit layer 10 may include first bonding pads BP1 provided in an uppermost metal layer of the photoelectric conversion circuit layer 10. The first bonding pads BP1 may be disposed in an uppermost one of the first interlayer insulating layers 110.

The first bonding pads BP1 of the photoelectric conversion circuit layer 10 may be connected to the transfer gate electrodes TGa, TGb, TGc and TGd, the floating diffusion regions FD (or FDa, FDb, FDc and FDd) and/or the ground dopant regions GR through contact plugs and metal lines.

For example, the first bonding pads BP1 may include at least one of tungsten (W), aluminum (Al), copper (Cu), tungsten nitride (WN), tantalum nitride (TaN), or titanium nitride (TiN), but example embodiments are not limited thereto.

In some example embodiments, the pixel circuit layer 20 may be disposed on the first interlayer insulating layer 110 of the photoelectric conversion circuit layer 10. The pixel circuit layer 20 may include the pixel circuits 20P of the unit pixels P of FIG. 3A, 3B or 3C. The pixel circuit layer 20 may be disposed between the photoelectric conversion circuit layer 10 and the logic circuit layer 40 in a vertical view.

The pixel circuit layer 20 may include a second semiconductor substrate 200, a through-plug TP, a through-insulating pattern TIP, and pixel transistors. The pixel transistors may include the source follower transistor SF (e.g., see FIG. 3A, 3B or 3C), the reset transistor RX (e.g., see FIG. 3A, 3B or 3C), the dual conversion gain transistor DCX (e.g., see FIG. 3A, 3B or 3C), and the selection transistor SX (e.g., see FIG. 3A, 3B or 3C).

More particularly, referring to FIGS. 4 and 6, the second semiconductor substrate 200 may have a first surface S1 and a second surface S2, which are opposite to each other. The second semiconductor substrate 200 may include a semiconductor material (e.g., silicon, germanium, or silicon-germanium) having the first conductivity type. The second semiconductor substrate 200 may be a bulk substrate or an epitaxial layer.

The second semiconductor substrate 200 may include a first well region 200*a* having the first conductivity type and a second well region 200*b* having the first conductivity type in each of the pixel groups PG. The first well region 200*a* and the second well region 200*b* may be isolated from each other by a device isolation pattern 201 and an isolation structure 203.

The device isolation pattern 201 may define first, second and third active portions AP1, AP2 and AP3 in the second well region 200*b* of the second semiconductor substrate 200. The first, second and third active portions AP1, AP2 and AP3 may correspond to portions of the second well region 200*b*. The device isolation pattern 201 may be disposed adjacent to the first surface S1 of the second semiconductor substrate 200. The device isolation pattern 201 may overlap with a portion of the isolation structure 203. The device isolation pattern 201 may be provided in a trench formed by recessing the first surface S1 of the second semiconductor substrate 200. The device isolation pattern 201 may be formed of an insulating material.

The isolation structure 203 isolating the first and second well regions 200*a* and 200*b* from each other may be disposed in the second semiconductor substrate 200. The isolation structure 203 may surround the first well region 200*a* when viewed in a plan view. The isolation structure 203 may be disposed in the second semiconductor substrate 200 and may vertically extend from the second surface S2 toward the first surface S1 of the second semiconductor substrate 200. The isolation structure 203 may completely or partially penetrate the second semiconductor substrate 200. The isolation structure 203 may be formed of an insulating material. In some example embodiments, the isolation structure 203 may be in contact with or penetrate the device isolation pattern 201.

The through-plug TP may penetrate the second semiconductor substrate 200 in each of the pixel groups PG. The through-plug TP may penetrate the first well region 200*a* of the second semiconductor substrate 200. The through-plugs TP may electrically connect the photoelectric conversion circuits of the photoelectric conversion circuit layer 10 to the pixel transistors (e.g., the source follower transistors) of the pixel circuit layer 20. For example, the through-plug TP may electrically connect the floating diffusion region FD of each of the pixel groups PG to the gate terminal of the source follower transistor. In some example embodiments, the through-plug TP may be provided in each of the pixel groups PG, and each of the pixel groups PG may include eight pixel regions PR. In other words, the eight pixel regions PR may share a single through-plug TP. For example, the through-plug TP may include a metal such as tungsten, copper, aluminum, or any alloy thereof, but example embodiments are not limited thereto.

The through-plug TP may penetrate a portion of a second interlayer insulating layer 210 provided on the first surface S1 of the second semiconductor substrate 200, and a third interlayer insulating layer 220 provided on the second surface S2 of the second semiconductor substrate 200.

A first end of the through-plug TP may be electrically connected to a second bonding pad BP2 provided in the third interlayer insulating layer 220. The second bonding pad BP2 may correspond to the first bonding pad BP1 of the photoelectric conversion circuit layer 10, and the first and second bonding pads BP1 and BP2 may be in direct contact with each other and may be connected to each other.

The through-insulating pattern TIP may penetrate the first well region 200*a* of the second semiconductor substrate 200. The through-insulating pattern TIP may surround a side surface of the through-plug TP. In other words, the through-insulating pattern TIP may be disposed between the through-plug TP and the second semiconductor substrate 200. A top surface of the through-insulating pattern TIP may be coplanar or substantially coplanar with the first surface S1 of the second semiconductor substrate 200, and a bottom surface of the through-insulating pattern TIP may be coplanar or substantially coplanar with the second surface S2 of the second semiconductor substrate 200. For example, the through-insulating pattern TIP may include silicon oxide, silicon nitride, and/or silicon oxynitride but example embodiments are not limited thereto.

The source follower transistor (e.g., see SF of FIG. 3A, 3B or 3C) may be provided on the first well region 200*a* of the second semiconductor substrate 200. More particularly, referring to FIGS. 4, 6, 7A and 7B, the source follower transistor may include a source follower gate electrode SFG disposed on the first surface S1 of the second semiconductor substrate 200, and source and drain regions SR and DR provided in the first well region 200*a* at both sides of the source follower gate electrode SFG. The source and drain regions SR and DR may be dopant regions doped with dopants having the second conductivity type.

A first pickup dopant region PUR1 may be spaced apart from the source and drain regions SR and DR of the source follower transistor and may be provided in the first well region 200*a*. The first pickup dopant region PUR1 may be a region doped with dopants having the first conductivity type. For example, the first pickup dopant region PUR1 may be spaced apart from the source region SR of the source follower transistor by the device isolation pattern 201.

In some example embodiments, at least some of the pixel transistors may be provided on the second well region 200*b* of the second semiconductor substrate 200.

More particularly, the reset transistor (e.g., see RX of FIG. 3A, 3B or 3C) and the dual conversion gain transistor (e.g., see DCX of FIG. 3A, 3B or 3C) may be provided on the first active portion AP1 of the second semiconductor substrate 200. The selection transistor (e.g., see SX of FIG. 3A, 3B or 3C) may be provided on the second active portion AP2 of the second semiconductor substrate 200.

In other words, a reset gate electrode RG and a conversion gain gate electrode DCG may be disposed on the first active portion AP1 of the second semiconductor substrate 200, and dopant regions SDR may be disposed in the first active portion AP1 at both sides of each of the reset gate electrode RG and the conversion gain gate electrode DCG.

A selection gate electrode SG may be disposed on the second active portion AP2 of the second semiconductor substrate 200, and dopant regions SDR may be disposed in the second active portion AP2 at both sides of the selection gate electrode SG.

A second pickup dopant region PUR2 may be disposed in the third active portion AP3 of the second semiconductor substrate 200. The second pickup dopant region PUR2 may be a region doped with dopants having the first conductivity type.

The second interlayer insulating layer 210 may cover the pixel transistors on the first surface S1 of the second semiconductor substrate 200. For example, the second interlayer insulating layer 210 may include first and second insulating layers 211 and 213 stacked sequentially. For example, the second interlayer insulating layer 210 may include silicon oxide, silicon nitride, and/or silicon oxynitride, but example embodiments are not limited thereto.

A first contact plug CT1 may penetrate the first and second insulating layers 211 and 213 of the second interlayer insulating layer 210 so as to be connected to the source follower gate electrode SFG, and a second contact plug CT2 may penetrate the second insulating layer 213 so as to be connected to the through-plug TP.

A first connection line CL1 may be disposed on the second insulating layer 213 and may connect the first and second contact plugs CT1 and CT2 to each other. In other words, the first connection line CL1 may electrically connect the gate terminal of the source follower transistor to the through-plug TP. That is, the first connection line CL1 may electrically connect the gate terminal of the source follower transistor to the floating diffusion region FD of each of the pixel groups PG.

A third contact plug CT3 may penetrate the first and second insulating layers 211 and 213 of the second interlayer insulating layer 210 so as to be connected to the source region SR, and a fourth contact plug CT4 may penetrate the first and second insulating layers 211 and 213 of the second interlayer insulating layer 210 so as to be connected to the first pickup dopant region PUR1.

A second connection line CL2 may be disposed on the second insulating layer 213 and may connect the third and fourth contact plugs CT3 and CT4 to each other. In other words, the second connection line CL2 may electrically connect the source region SR of the source follower transistor to the first pickup dopant region PUR1. That is, the source terminal of the source follower transistor may be electrically connected to the first well region 200*a* of the second semiconductor substrate 200 (e.g., a body of the source follower transistor).

Thus, in operation of the image sensor, an electric potential of the first well region 200*a* of the second semiconductor substrate 200 may be changed in proportion to an electric potential of the floating diffusion region FD. In other words, it is possible to reduce a parasitic capacitance existing between the first well region 200*a* of the second semiconductor substrate 200 and the through-plug TP.

A fifth contact plug CT5 may penetrate the first and second insulating layers 211 and 213 of the second interlayer insulating layer 210 so as to be connected to the dopant region SDR provided at a side of the reset gate electrode RG.

A sixth contact plug CT6 may penetrate the first and second insulating layers 211 and 213 of the second interlayer insulating layer 210 so as to be connected to the dopant region SDR provided at another side of the conversion gain gate electrode DCG.

Seventh and eighth contact plugs CT7 and CT8 may penetrate the first and second insulating layers 211 and 213 of the second interlayer insulating layer 210 so as to be connected to the dopant regions SDR provided at both sides of the selection gate electrode SG.

A ninth contact plug CT9 may penetrate the first and second insulating layers 211 and 213 of the second interlayer insulating layer 210 so as to be connected to the second pickup dopant region PUR2. In some example embodiments, a ground voltage may be applied to the second pickup dopant region PUR2 through the ninth contact plug CT9. In other words, in operation of the image sensor, an electric potential of the second well region 200*b* may be different from the electric potential of the first well region 200*a*.

Referring again to FIG. 4, the pixel circuit layer 20 may include the second bonding pads BP2 provided in an uppermost metal layer of the third interlayer insulating layer 220, and third bonding pads BP3 provided in an uppermost metal layer of the second interlayer insulating layer 210. For example, the second and third bonding pads BP2 and BP3 may include at least one of tungsten (W), aluminum (Al), copper (Cu), tungsten nitride (WN), tantalum nitride (TaN), or titanium nitride (TiN), but example embodiments are not limited thereto.

In some example embodiments, the second bonding pads BP2 of the pixel circuit layer 20 may be bonded to the first bonding pads BP1 of the photoelectric conversion circuit layer 10.

The photoelectric conversion circuit layer 10 and the pixel circuit layer 20 may be electrically connected to each other by directly bonding the first and second bonding pads BP1 and BP2 provided in the uppermost metal layers of the photoelectric conversion circuit layer 10 and the pixel circuit layer 20.

The first bonding pads BP1 of the photoelectric conversion circuit layer 10 and the second bonding pads BP2 of the pixel circuit layer 20 may be connected directly to each other by a hybrid bonding method. The hybrid bonding method may mean a bonding method in which two components including the same kind of a material are fused into one at their interface. For example, when the first and second bonding pads BP1 and BP2 are formed of copper (Cu), the first and second bonding pads BP1 and BP2 may be physically and electrically connected to each other by a copper (Cu)-copper (Cu) bonding method. In addition, a surface of the first interlayer insulating layer 110 of the photoelectric conversion circuit layer 10 and a surface of the third interlayer insulating layer 220 of the pixel circuit layer 20 may be bonded to each other by a dielectric material-dielectric material bonding method.

In some example embodiments, the light-transmitting layer 30 may be disposed on the second surface 100*b* of the first semiconductor substrate 100. The light-transmitting layer 30 may include a planarization insulating layer 510, a grid structure 520, color filters 530, and micro lenses 540. The light-transmitting layer 30 may concentrate and filter light incident from the outside and may provide the concentrated and filtered light into the photoelectric conversion circuit layer 10.

More particularly, the planarization insulating layer 510 may cover the second surface 100*b* of the first semiconductor substrate 100. The planarization insulating layer 510 may be formed of a transparent insulating material and may include a plurality of layers. The planarization insulating layer 510 may be formed of an insulating material having a refractive index different from that of the first semiconductor substrate 100. The planarization insulating layer 510 may include a metal oxide and/or silicon oxide.

The grid structure 520 may be disposed on the planarization insulating layer 510. Like the pixel isolation structure PIS, the grid structure 520 may have a grid shape when viewed in a plan view. The grid structure 520 may overlap with the pixel isolation structure PIS when viewed in a plan view. In other words, the grid structure 520 may include first portions extending in the first direction D1, and second portions intersecting the first portions and extending in the second direction D2. A width of the grid structure 520 may be substantially equal to or less than a minimum width of the pixel isolation structure PIS.

The grid structure 520 may include a light-blocking pattern and/or a low-refractive index pattern. For example, the light-blocking pattern may include a metal material such as titanium, tantalum or tungsten, but example embodiments are not limited thereto. The low-refractive index pattern may be formed of a material having a refractive index lower than that of the light-blocking pattern. The low-refractive index pattern may be formed of an organic material and may have a refractive index of about 1.1 to about 1.3. For example, the grid structure 520 may include a polymer layer including silica nanoparticles.

The color filters 530 may be formed to correspond to the pixel regions PR, respectively. The color filters 530 may fill spaces defined by the grid structure 520. Depending on properties of the unit pixel, each of the color filters 530 may include a red, green or blue color filter or may include a magenta, cyan or yellow color filter, but example embodiments are not limited thereto.

The micro lenses 540 may be disposed on the color filters 530. The micro lenses 540 may have convex shapes and may have a desired (or alternatively, predetermined) curvature radius. The micro lenses 540 may be formed of a transparent resin.

The logic circuit layer 40 may be bonded to the pixel circuit layer 20. The logic circuit layer 40 may include logic circuits (e.g., see elements 2, 3, 4, 5, 6, 7 and 8 of FIG. 1), a power circuit, an input/output interface, and/or an image signal processor. In other words, the logic circuit layer 40 may include the other components except the pixel array 1 in the image sensor of FIG. 1.

More particularly, the logic circuit layer 40 may include a third semiconductor substrate 300, logic circuits LC, logic interlayer insulating layers 310 covering the logic circuits LC, and logic interconnection lines 311 connected to the logic circuits LC. An uppermost one of the logic interlayer insulating layers 310 may be bonded to the second interlayer insulating layer 210 of the pixel circuit layer 20.

Fourth bonding pads BP4 may be provided in the uppermost one of the logic interlayer insulating layers 310, and the fourth bonding pads BP4 may be bonded to the third bonding pads BP3 of the pixel circuit layer 20.

Since the third and fourth bonding pads BP3 and BP4 are bonded directly to each other, the photoelectric conversion circuit layer 10 and the pixel circuit layer 20 may be electrically connected to the logic circuit layer 40. The third bonding pads BP3 and the fourth bonding pads BP4 may also be electrically connected directly to each other by the hybrid bonding method.

Figure 8A:
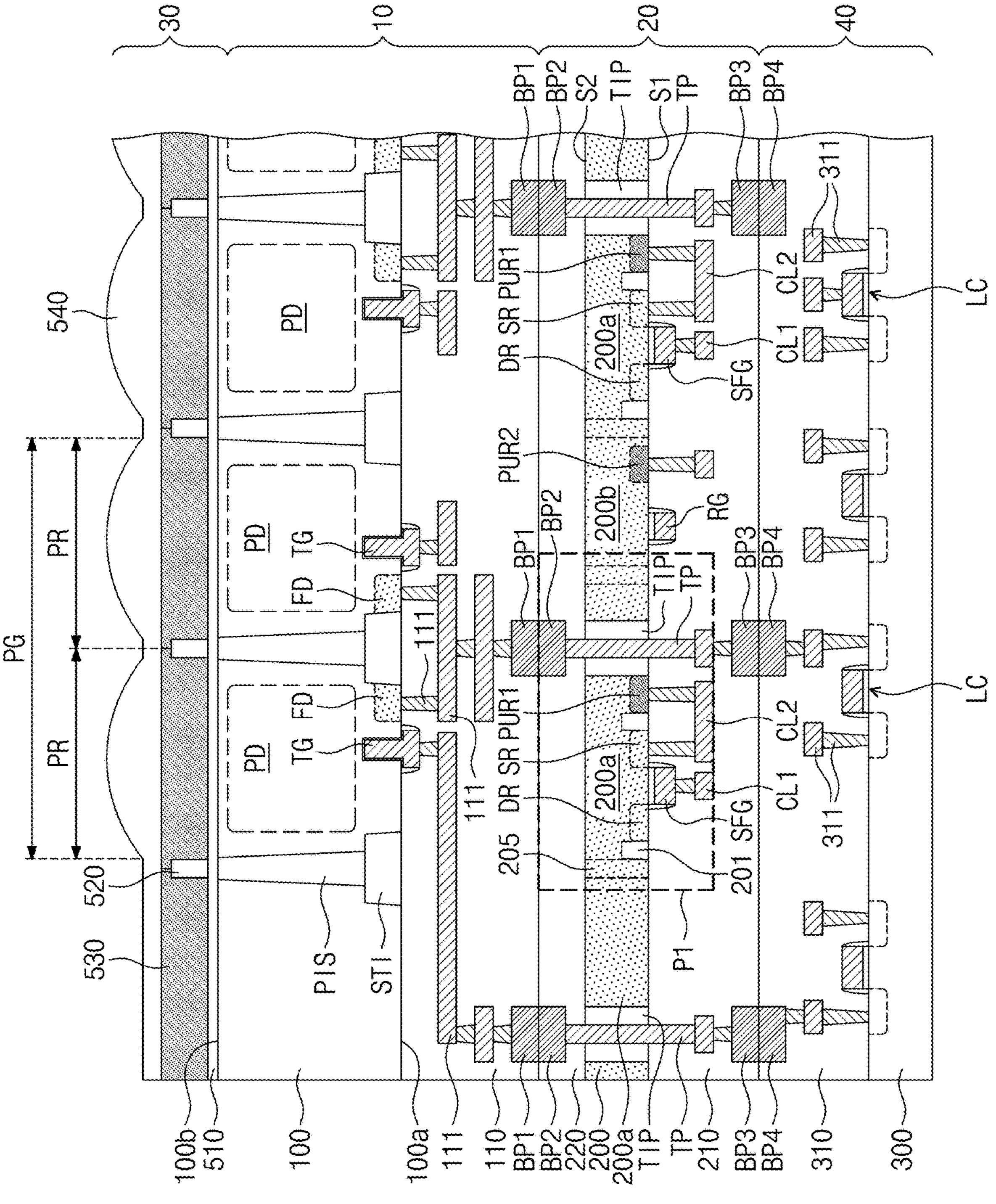
FIG. 8A is a cross-sectional view illustrating a portion of an image sensor according to some example embodiments of the inventive concepts.
Figure 8B:
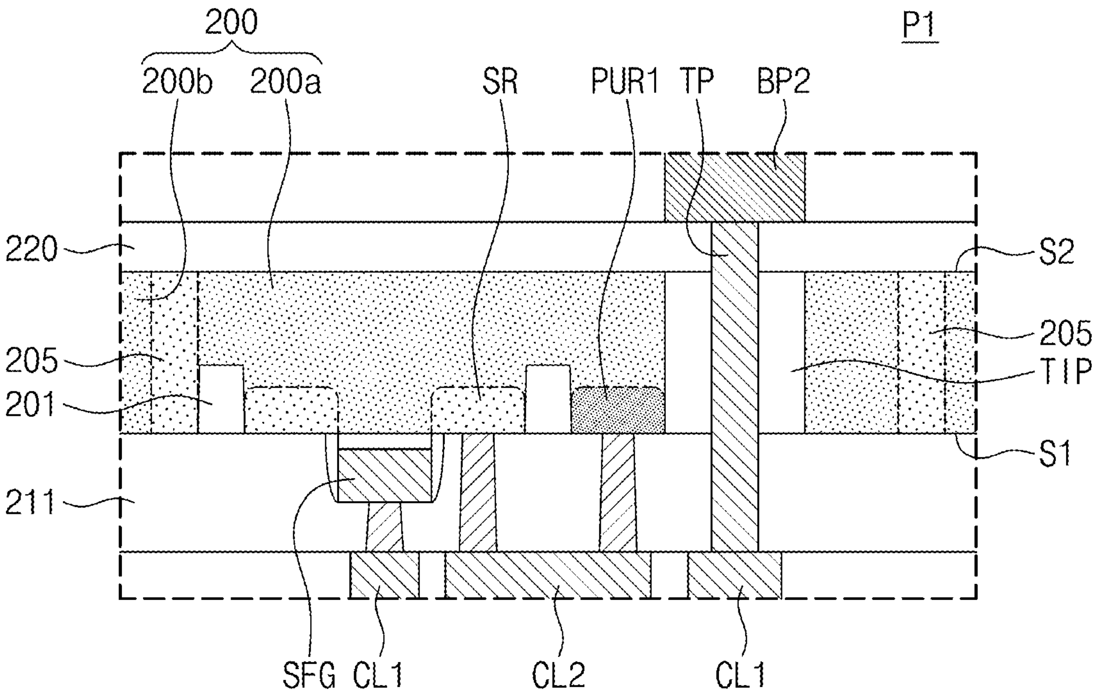
FIG. 8B is an enlarged view of a portion 'P1' of FIG. 8A.

FIG. 8A is a cross-sectional view illustrating a portion of an image sensor according to some example embodiments of the inventive concepts. FIG. 8B is an enlarged view of a portion 'P1' of FIG. 8A. Hereinafter, the descriptions to the same technical features as mentioned above will be omitted and differences between the example embodiments below and the above example embodiments will be mainly described, for the purpose of ease and convenience in explanation.

Referring to FIGS. 8A and 8B, the pixel circuit layer 20 may include the second semiconductor substrate 200, the through-plug TP, the through-insulating pattern TIP, and the pixel transistors, as described above. The second semiconductor substrate 200 may include the first well region 200*a* and the second well region 200*b* in each of the pixel groups PG. Here, the first well region 200*a* and the second well region 200*b* may be electrically isolated from each other by an isolation well region 205 instead of the isolation structure 203 (e.g., see FIG. 4).

More particularly, the isolation well region 205 surrounding the first well region 200*a* may be provided in the second semiconductor substrate 200 having the first conductivity type. The isolation well region 205 may be a region doped with dopants having the second conductivity type. In other words, PN junctions may be formed between the isolation well region 205 and the first and second well regions 200*a* and 200*b* to electrically isolate the first well region 200*a* from the second well region 200*b*.

Figure 9A:
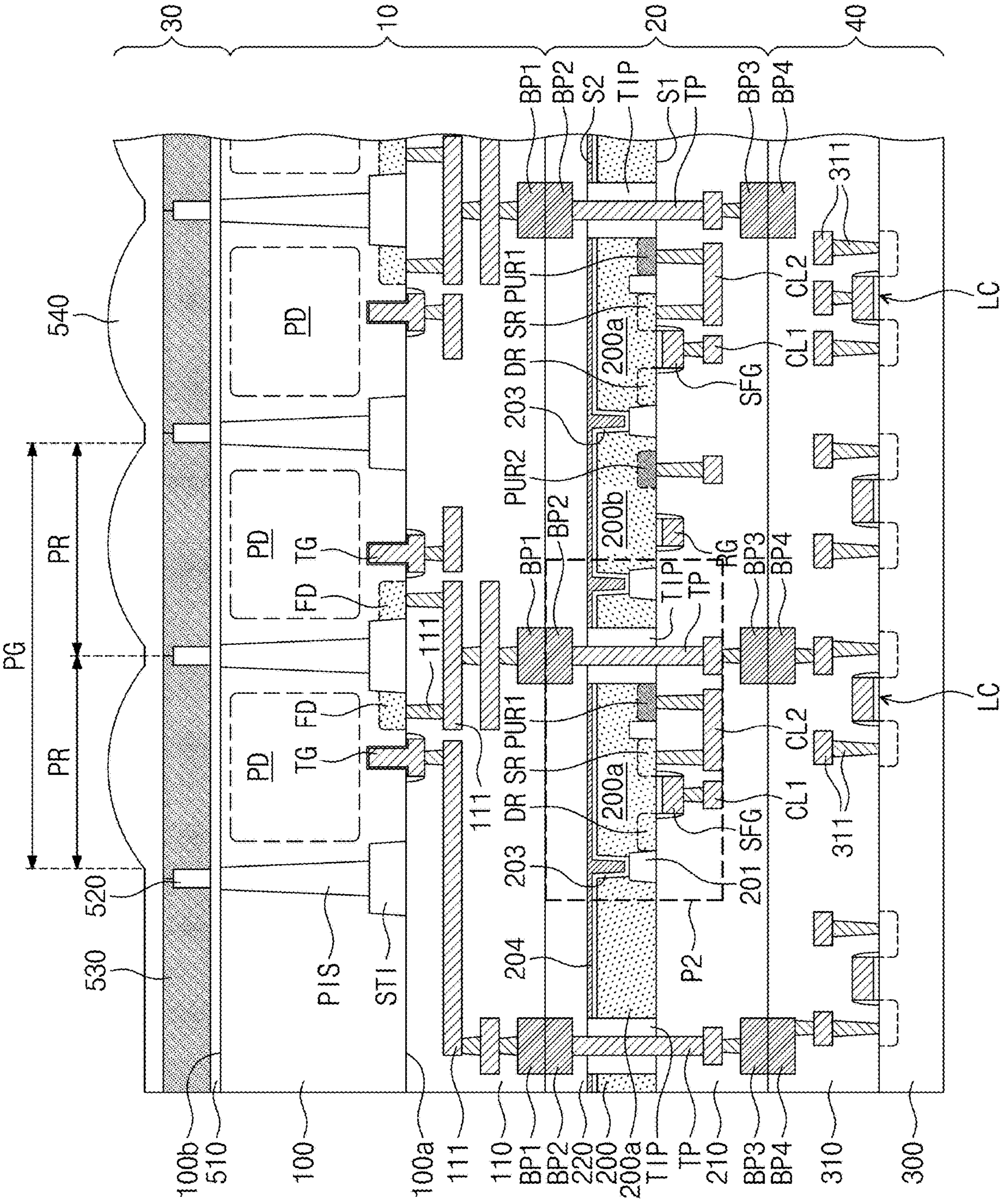
FIG. 9A is a cross-sectional view illustrating a portion of an image sensor according to some example embodiments of the inventive concepts.
Figure 9B:
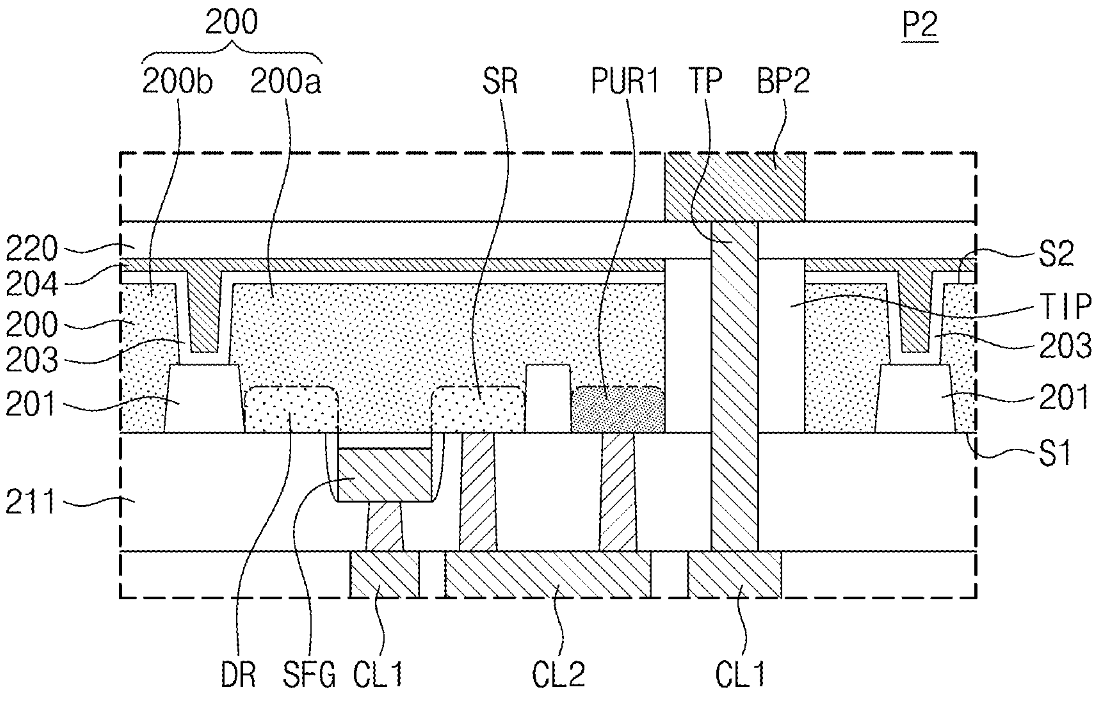
FIG. 9B is an enlarged view of a portion 'P2' of FIG. 9A.

FIG. 9A is a cross-sectional view illustrating a portion of an image sensor according to some example embodiments of the inventive concepts. FIG. 9B is an enlarged view of a portion 'P2' of FIG. 9A.

Referring to FIGS. 9A and 9B, the pixel circuit layer 20 may include the second semiconductor substrate 200, the through-plug TP, the through-insulating pattern TIP, and the pixel transistors, as described above. The second semiconductor substrate 200 may include the first well region 200*a* and the second well region 200*b* in each of the pixel groups PG. Here, the first well region 200*a* and the second well region 200*b* may be isolated from each other by an isolation structure 203.

The isolation structure 203 may vertically penetrate the second semiconductor substrate 200 and may cover the second surface S2 of the second semiconductor substrate 200.

A conductive pattern 204 may be disposed on the isolation structure 203. A portion of the conductive pattern 204 may extend vertically to the second surface S2 of the second semiconductor substrate 200 and may be disposed in the isolation structure 203. The conductive pattern 204 may include a metal material such as tungsten (W) or titanium (Ti). In operation of the image sensor, a desired (or alternatively predetermined) bias may be applied to the conductive pattern 204. The conductive pattern 204 may perform a shielding function between the photoelectric conversion circuit layer 10 and the pixel circuit layer 20.

Figure 10:
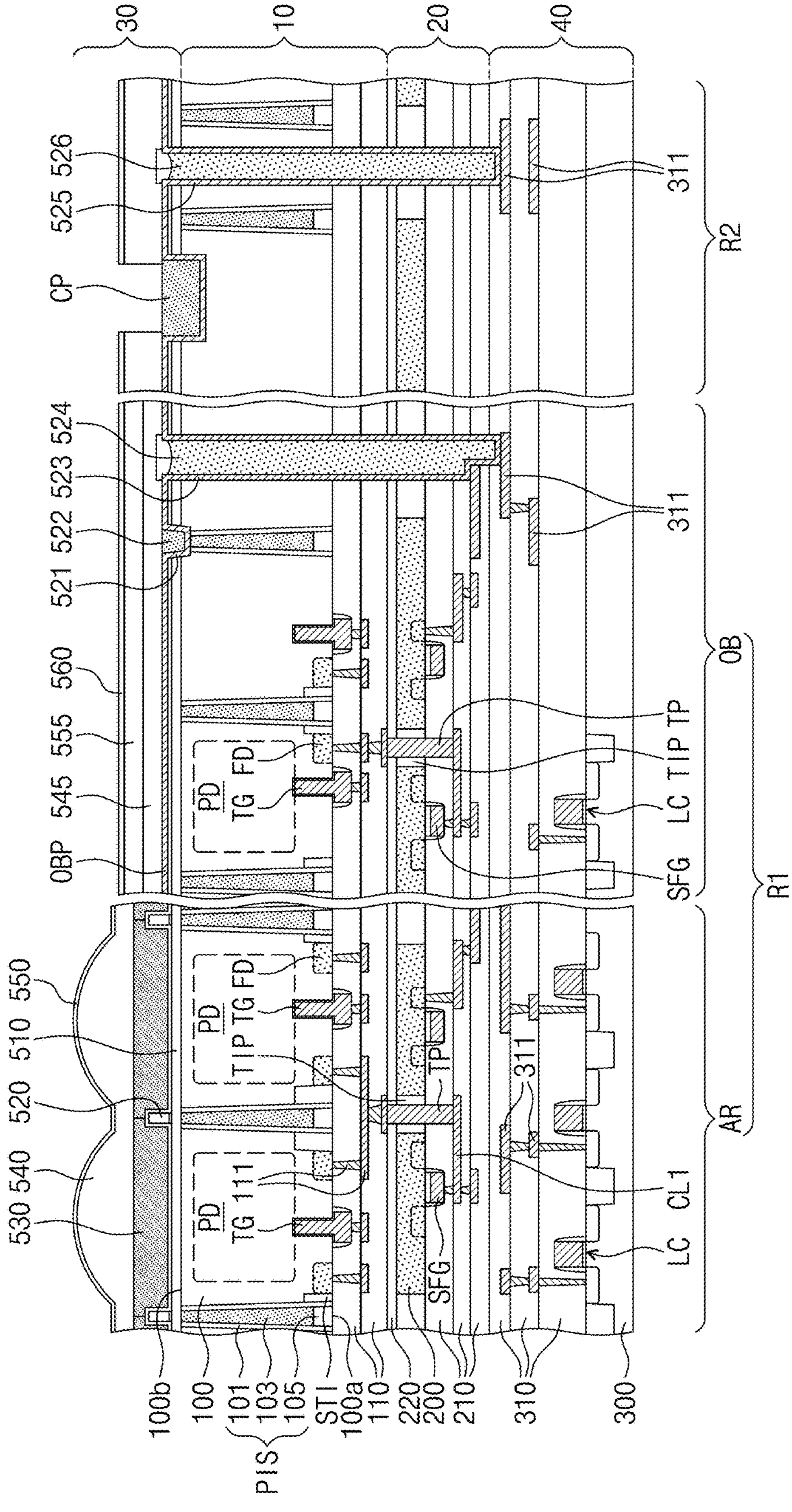
FIGS. 10 and 11 are cross-sectional views illustrating image sensors according to some example embodiments of the inventive concepts.
Figure 11:
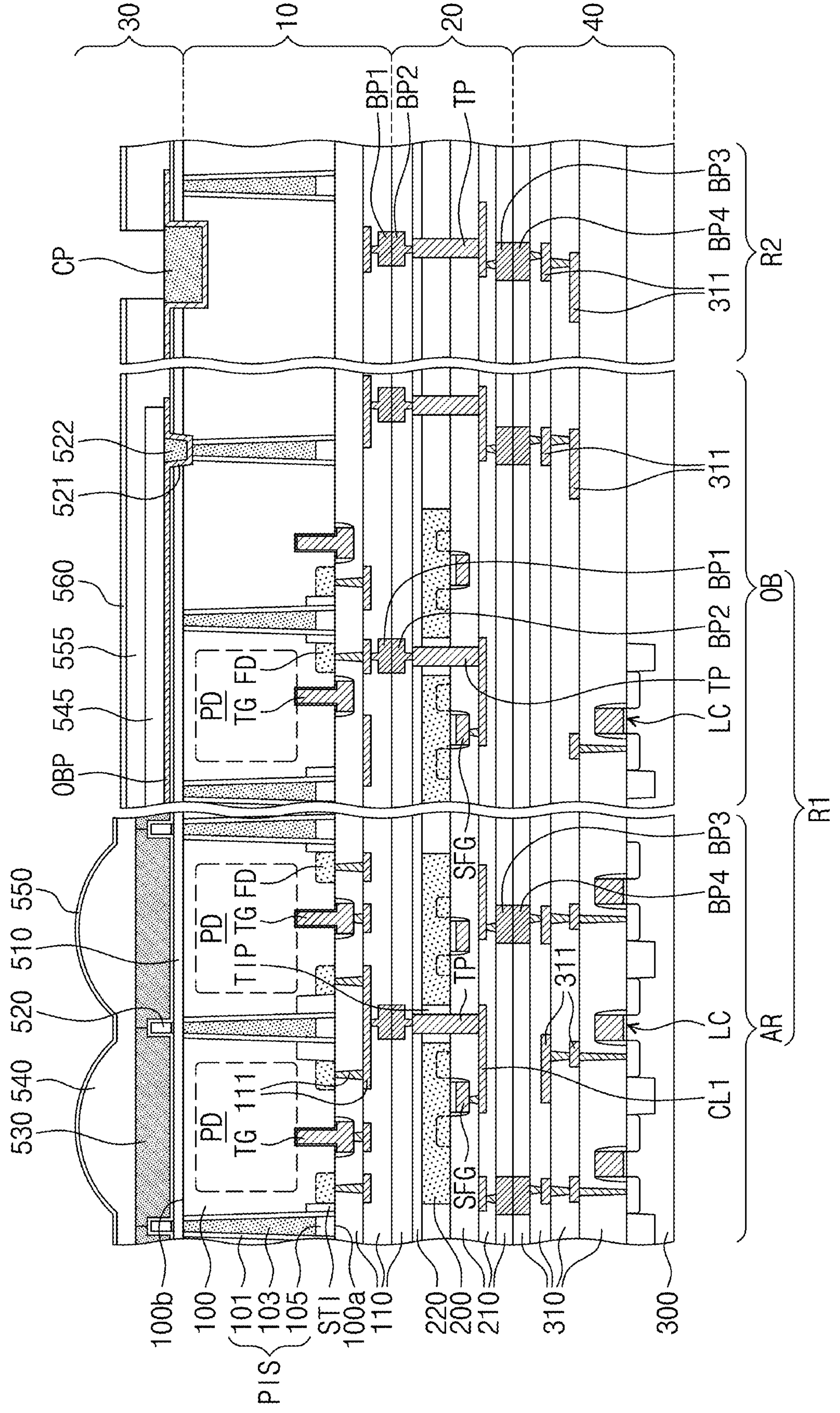

FIGS. 10 and 11 are cross-sectional views illustrating image sensors according to some example embodiments of the inventive concepts.

Referring to FIG. 10, an image sensor may include a pixel array region R1 and a pad region R2. The pixel array region R1 may include a plurality of unit pixels two-dimensionally arranged in the first and second directions D1 and D2 intersecting each other. An electrical signal generated by incident light may be outputted from each of the unit pixels of the pixel array region R1.

The pixel array region R1 may include a light-receiving region AR and a light-blocking region OB. The light-blocking region OB may surround the light-receiving region AR when viewed in a plan view. In other words, the light-blocking region OB may be disposed at top, bottom, left and right sides of the light-receiving region AR when viewed in a plan view. Reference pixels to which light is not incident may be provided in the light-blocking region OB, and magnitudes of electrical signals sensed from the unit pixels may be calculated by comparing the amount of reference charges generated from the reference pixels with the amount of charges sensed from the unit pixels of the light-receiving region AR.

The image sensor in the light-receiving region AR may have the same or substantially the same technical features as the image sensor described above. In other words, the image sensor may include a photoelectric conversion circuit layer 10, a pixel circuit layer 20, a light-transmitting layer 30, and a logic circuit layer 40, as described above. In a vertical view, the photoelectric conversion circuit layer 10 may be disposed between the pixel circuit layer 20 and the light-transmitting layer 30, and the pixel circuit layer 20 may be adjacent to the logic circuit layer 40.

A pixel isolation structure PIS in a first semiconductor substrate 100 may define pixel regions in the light-receiving region AR and the light-blocking region OB.

The pixel isolation structure PIS may include a liner insulating pattern 101, a semiconductor pattern 103, and a capping pattern 105. The semiconductor pattern 103 may vertically penetrate a portion of the first semiconductor substrate 100, and the liner insulating pattern 101 may be provided between the semiconductor pattern 103 and the first semiconductor substrate 100. The capping pattern 105 may be disposed on the semiconductor pattern 103 and may have a top surface provided at substantially the same level as a top surface of a device isolation layer STI.

Each of the liner insulating pattern 101 and the capping pattern 105 may include at least one of a silicon oxide layer, a silicon oxynitride layer, or a silicon nitride layer, but example embodiments are not limited thereto. The semiconductor pattern 103 may include an undoped poly-silicon layer or a poly-silicon layer doped with dopants. In some example embodiments, the semiconductor pattern 103 may include an air gap or a void.

A portion (e.g., the semiconductor pattern 103) of the pixel isolation structure PIS may be electrically connected to a contact pad plug 521 in the light-blocking region OB.

A planarization insulating layer 510 of the light-transmitting layer 30 may extend from the light-receiving region AR onto the light-blocking region OB and the pad region R2.

In the light-blocking region OB, a light-blocking pattern OBP may be disposed on the planarization insulating layer 510. The light-blocking pattern OBP may inhibit or prevent light from being incident to photoelectric conversion regions PD provided in the light-blocking region OB. The photoelectric conversion regions PD in reference pixel regions of the light-blocking region OB may not output photoelectric signals but may output noise signals. The noise signals may be generated by electrons generated by generated heat or a dark current. For example, the light-blocking pattern OBP may include a metal such as tungsten, copper, aluminum, or any alloy thereof, but example embodiments are not limited thereto.

A filtering layer 545 may be provided on the light-blocking pattern OBP. The filtering layer 545 may block light having a different wavelength from those of light blocked by color filters 530. For example, the filtering layer 545 may block infrared light. The filtering layer 545 may include, but is not limited to, a blue color filter.

The contact pad plug 521 may be provided on the second surface 100*b* of the light-blocking region OB of the first semiconductor substrate 100. A contact trench may be formed in the second surface 100*b* of the first semiconductor substrate 100, and the contact pad plug 521 may be provided in the contact trench.

A contact pad 522 may be connected to the contact pad plug 521. The contact pad 522 may include a conductive material different from that of the contact pad plug 521. For example, the contact pad 522 may include aluminum. The contact pad 522 may be electrically connected to the semiconductor pattern 103 of the pixel isolation structure PIS. A negative bias may be applied to the semiconductor pattern 103 of the pixel isolation structure PIS through the contact pad 522, and a predetermined bias may be transmitted to the pixel array region R1.

The logic circuit layer 40 may be electrically connected to the photoelectric conversion circuit layer 10 through a first through-conductive pattern 523 and a second through-conductive pattern 525.

More particularly, in the light-blocking region OB, the first through-conductive pattern 523 may penetrate the first semiconductor substrate 100 so as to be electrically connected to conductive lines of the pixel circuit layer 20 and logic interconnection lines 311 of the logic circuit layer 40. The first through-conductive pattern 523 may have a first bottom surface and a second bottom surface, which are located at different levels. A first gap-fill pattern 524 may be provided in an inner space surrounded by the first through-conductive pattern 523. The first gap-fill pattern 524 may include a low-refractive index material and may have an insulating property.

In the pad region R2, a plurality of conductive pads CP used to input/output control signals and photoelectric signals may be disposed at the second surface 100*b* of the first semiconductor substrate 100. In the pad region R2, the conductive pads CP may be buried in the second surface 100*b* of the first semiconductor substrate 100. For example, the conductive pads CP may be provided in pad trenches formed in the second surface 100*b* of the first semiconductor substrate 100 in the pad region R2. The conductive pads CP may include a metal such as aluminum, copper, tungsten, titanium, tantalum, or any alloy thereof, but example embodiments are not limited thereto. In a process of mounting the image sensor, bonding wires may be bonded to the conductive pads CP. The conductive pads CP may be electrically connected to an external device through the bonding wires.

In the pad region R2, the second through-conductive pattern 525 may penetrate the first semiconductor substrate 100 so as to be electrically connected to the logic interconnection lines 311 of the logic circuit layer 40. The second through-conductive pattern 525 may extend onto the second surface 100*b* of the first semiconductor substrate 100 so as to be electrically connected to the conductive pads CP. A portion of the second through-conductive pattern 525 may cover a bottom surface and side surfaces of the conductive pad CP. A second gap-fill pattern 526 may be provided in an inner space surrounded by the second through-conductive pattern 525. The second gap-fill pattern 526 may include a low-refractive index material and may have an insulating property. In the pad region R2, the pixel isolation structure PIS may be provided around the second through-conductive pattern 525.

The photoelectric conversion circuit layer 10 and the logic circuit layer 40 are electrically connected to each other through the first and second through-conductive patterns 523 and 525 in some example embodiments, but example embodiments of the inventive concepts are not limited thereto. In some embodiments, a first protection layer 550 may be disposed on and cover the micro lenses 540. In some embodiments, an upper planarization layer 555 may be disposed on the second surface 100*b* of the first semiconductor substrate 100 in the light-blocking region OB and the pad region R2. For example, the upper planarization layer 555 may cover the filtering layer 545 in the light-blocking region OB, and may cover the second through-conductive pattern 525 and expose the conductive pads CP in the pad region R2. In some embodiments, a second protection layer 560 may be provided on the upper planarization layer 555.

According to the example embodiment of FIG. 11, the first and second through-conductive patterns 523 and 525 of FIG. 10 may be omitted, and first, second, third and fourth bonding pads BP1, BP2, BP3 and BP4 may be provided in the pixel array region R1 and the pad region R2.

The first and second bonding pads BP1 and BP2 may be bonded to each other to electrically connect the photoelectric conversion circuit layer 10 to the pixel circuit layer 20, and the third and fourth bonding pads BP3 and BP4 may be bonded to each other to electrically connect the pixel circuit layer 20 to the logic circuit layer 40.

According to some example embodiments of the inventive concepts, in the image sensor in which the second semiconductor substrate including the pixel transistors is stacked on the first semiconductor substrate including the photoelectric conversion elements, the source terminal of the source follower transistor on the second semiconductor substrate may be electrically connected to the second semiconductor substrate. Thus, it is possible to reduce a parasitic capacitance between the second semiconductor substrate and the through-plug electrically connected to the source follower transistor. In addition, a body effect in the second semiconductor substrate may be removed, and thus a conversion gain in the unit pixel may be increased.

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some example embodiments of the inventive concepts have been particularly shown and described, it will be understood by one of ordinary skill in the art that variations in form and detail may be made therein without departing from scope of the inventive concepts.

What is claimed is:

1. An image sensor comprising:

a photoelectric conversion element in a first semiconductor substrate;

a second semiconductor substrate on the first semiconductor substrate, the second semiconductor substrate including a first well region having a first conductivity type;

a source follower transistor on the first well region of the second semiconductor substrate;

a through-plug penetrating the second semiconductor substrate, the through-plug electrically connecting the photoelectric conversion element to the source follower transistor, wherein a source terminal of the source follower transistor is electrically connected to the second semiconductor substrate;

a first pickup dopant region in the first well region;

a first connection line electrically connecting the source terminal of the source follower transistor to the first pickup dopant region; and an isolation structure in the second semiconductor substrate, the isolation structure surrounding the first well region when viewed in a plan view, wherein the second semiconductor substrate includes a second well region separated from the first well region by the isolation structure.

2. The image sensor of claim 1, further comprising:

a second connection line electrically connecting a gate terminal of the source follower transistor to the through-plug.

3. The image sensor of claim 1, further comprising:

a reset transistor on the second well region of the second semiconductor substrate; and a second pickup dopant region in the second well region.

4. The image sensor of claim 1, wherein the first well region is electrically isolated from the second well region.

5. The image sensor of claim 1, wherein the through-plug penetrates the first well region of the second semiconductor substrate.

6. The image sensor of claim 1, further comprising:

a through-insulating pattern penetrating the second semiconductor substrate, the through-insulating pattern surrounding a side surface of the through-plug.

7. The image sensor of claim 1, further comprising:

a floating diffusion region in the first semiconductor substrate; and a transfer gate electrode between the photoelectric conversion element and the floating diffusion region, wherein the through-plug is electrically connected to the floating diffusion region.

8. An image sensor comprising:

a first semiconductor substrate including a plurality of pixel regions, each of the plurality of pixel regions including a photoelectric conversion region and a floating diffusion region;

a second semiconductor substrate on the first semiconductor substrate, the second semiconductor substrate including a first well region having a first conductivity type;

a source follower transistor on the second semiconductor substrate, the source follower transistor comprising a source follower gate on the first well region of the second semiconductor substrate, and the source follower transistor including a source region and a drain region each having a second conductivity type, the source region and the drain region each in the first well region at multiple sides of the source follower gate;

a through-plug penetrating the second semiconductor substrate, the through-plug electrically connecting the floating diffusion region to the source follower gate;

a first pickup dopant region having the first conductivity type, the first pickup dopant region in the first well region of the second semiconductor substrate; and a first connection line connecting the source region of the source follower transistor to the first pickup dopant region.

9. The image sensor of claim 8, further comprising:

an isolation structure in the second semiconductor substrate, the isolation structure surrounding the first well region when viewed in a plan view; and a reset transistor spaced apart from the first well region, the reset transistor on the second semiconductor substrate.

10. The image sensor of claim 9, wherein the isolation structure comprises an isolation insulating pattern vertically penetrating the second semiconductor substrate.

11. The image sensor of claim 9, wherein the second semiconductor substrate includes a first surface and a second surface, which are opposite to each other, and the isolation structure comprises an isolation well region having the second conductivity type, the isolation well region vertically extending from the first surface to the second surface of the second semiconductor substrate.

12. The image sensor of claim 9, wherein the isolation structure comprises:

an isolation insulating pattern vertically penetrating the second semiconductor substrate; and a conductive pattern in the isolation insulating pattern.

13. The image sensor of claim 9, further comprising:

a second pickup dopant region which has the first conductivity type, is spaced apart from the first well region, and is in the second semiconductor substrate.

14. The image sensor of claim 8, further comprising:

a through-insulating pattern penetrating the first well region and surrounding a side surface of the through-plug.

15. The image sensor of claim 8, wherein the source follower transistor is in at least two of the floating diffusion regions of the plurality of pixel regions.

16. The image sensor of claim 8, further comprising:

a device isolation pattern between the source region of the source follower transistor and the first pickup dopant region in the first well region.

17. The image sensor of claim 8, further comprising:

a transfer gate electrode on a first surface of the first semiconductor substrate, the transfer gate electrode between the photoelectric conversion region and the floating diffusion region in each of the pixel regions;

a first interlayer insulating layer covering the transfer gate electrode on the first surface of the first semiconductor substrate;

a second interlayer insulating layer between the first interlayer insulating layer and a second surface of the second semiconductor substrate;

a third interlayer insulating layer on a first surface of the second semiconductor substrate, the third interlayer insulating layer covering the source follower transistor;

a first bonding pad in the first interlayer insulating layer, the first bonding pad connected to the floating diffusion region; and a second bonding pad which is in the second interlayer insulating layer, is in contact with the first bonding pad, and is connected to a first end of the through-plug.

18. An image sensor comprising:

a photoelectric conversion circuit layer comprising photoelectric conversion elements in a first semiconductor substrate;

a pixel circuit layer comprising pixel transistors on a second semiconductor substrate; and a logic circuit layer comprising logic circuits on a third semiconductor substrate, the logic circuits connected to the pixel transistors, wherein the pixel circuit layer comprises an isolation structure in the second semiconductor substrate to isolate a first well region and a second well region from each other, the first well region and the second well region having a first conductivity type, a source follower transistor on the first well region, a reset transistor on the second well region, a first pickup dopant region having the first conductivity type, the first pickup dopant region in the first well region, a second pickup dopant region having the first conductivity type, the second pickup dopant region in the second well region, a through-plug penetrating the first well region of the second semiconductor substrate, the through-plug electrically connecting at least one of the photoelectric conversion elements to a gate terminal of the source follower transistor, a through-insulating pattern penetrating the first well region and surrounding a side surface of the through-plug, and a first connection line electrically connecting a source terminal of the source follower transistor to the first pickup dopant region.

* * * * *